United States Patent
Hosoi et al.

(10) Patent No.: US 7,852,892 B2
(45) Date of Patent: Dec. 14, 2010

(54) SEMICONDUCTOR LASER DEVICE AND METHOD FOR MANUFACTURING THE SAME

(75) Inventors: Hiroyuki Hosoi, Hyogo (JP); Kouji Makita, Hyogo (JP); Michinari Yamanaka, Hyogo (JP)

(73) Assignee: Panasonic Corporation, Osaka (JP)

( * ) Notice: Subject to any disclaimer, the term of this patent is extended or adjusted under 35 U.S.C. 154(b) by 628 days.

(21) Appl. No.: 11/571,112

(22) PCT Filed: Jan. 12, 2006

(86) PCT No.: PCT/JP2006/000297

§ 371 (c)(1),
(2), (4) Date: Dec. 21, 2006

(87) PCT Pub. No.: WO2006/077766

PCT Pub. Date: Jul. 27, 2006

(65) Prior Publication Data

US 2009/0147814 A1    Jun. 11, 2009

(30) Foreign Application Priority Data

Jan. 18, 2005  (JP) .............................. 2005-010785

(51) Int. Cl.
  *H01S 5/00* (2006.01)
(52) U.S. Cl. .................. 372/46.01; 372/44.011
(58) Field of Classification Search .............. 372/46.01, 372/44.011
  See application file for complete search history.

(56) References Cited

U.S. PATENT DOCUMENTS

| | | | |
|---|---|---|---|
| 5,264,389 A | * | 11/1993 | Hamada et al. ............... 438/22 |
| 6,395,573 B1 | | 5/2002 | Jang et al. |
| 6,618,411 B1 | * | 9/2003 | Takiguchi et al. ......... 372/45.01 |
| 2002/0187577 A1 | | 12/2002 | Sakata et al. |
| 2004/0022287 A1 | * | 2/2004 | Yoshitake et al. ............. 372/45 |
| 2005/0030997 A1 | * | 2/2005 | Tanaka et al. ................. 372/46 |

FOREIGN PATENT DOCUMENTS

| | | |
|---|---|---|
| JP | 2000-294877 | 10/2000 |
| JP | 2000-340887 | 12/2000 |
| JP | 2003-69154 | 3/2003 |
| JP | 2003-298168 | 10/2003 |
| JP | 2004342719 A * | 12/2004 |

\* cited by examiner

*Primary Examiner*—Minsun Harvey
*Assistant Examiner*—Joshua King
(74) *Attorney, Agent, or Firm*—Hamre, Schumann, Mueller & Larson, P.C.

(57) ABSTRACT

A ridge stripe semiconductor laser device includes a first conductivity type cladding layer 103, an active layer 104, a second conductivity type first cladding layer 105, a second conductivity type second cladding layer 108 in a ridge-shaped stripe for confining light in a horizontal transverse direction, and a current blocking layer 107 formed in a region except for at least a part on a ridge that are disposed on a semiconductor substrate 102. In a cross-section perpendicular to a stripe direction of the ridge, each of both lateral surfaces of the ridge includes a first surface 118 that is substantially perpendicular to a surface of the semiconductor substrate and extends downward from an upper end of the ridge, and a second surface 119 that is formed of a substantially linear skirt portion inclined surface that is inclined obliquely downward to an outside of the ridge in a skirt portion of the ridge. The first surface and the second surface are connected directly, or connected via a third intermediate surface. A (111) plane of a semiconductor constituting the second cladding layer is exposed to the second surface. The present invention provides a high power semiconductor laser device with a high kink level and a low operating current.

5 Claims, 16 Drawing Sheets

(j)

(l)

(k)

(m)

(k')

(n)

(a)

(b)

(c)

SEMICONDUCTOR LASER DEVICE AND METHOD FOR MANUFACTURING THE SAME

TECHNICAL FIELD

The present invention relates to a semiconductor laser device used as a light source in an optical disk apparatus, an information processing apparatus or the like, and a method for manufacturing the same.

BACKGROUND ART

Accompanying higher density recording in optical disks such as DVDs, not only DVD drives for reproduction but also DVD drives for recording information in DVD-RAMs, DVD-RW or the like have become commercialized. Also, their recording speed keeps increasing.

In response to such an increasing recording speed of the DVD drives for recording, there has been a demand for higher power semiconductor lasers used as their light source. As an effective means of achieving the higher power of semiconductor lasers, various suggestions have been made; one of which is to process a cladding layer above an active layer, thus forming a ridge-shaped stripe having high perpendicularity and high symmetry. Incidentally, having high perpendicularity and high symmetry means that ridge lateral wall surfaces (lateral surfaces) are substantially perpendicular to a semiconductor substrate surface in a cross-section perpendicular to a longitudinal direction (stripe direction) of the ridge and that the ridge has an excellent right-left symmetrical cross-section, respectively. In the present invention, the cross-section perpendicular to the ridge stripe direction means a cross-section that crosses the longitudinal direction of the ridge at a right angle.

By improving the perpendicularity and symmetry of the ridge shape in the cross-section perpendicular to the longitudinal direction (stripe direction) of the ridge and controlling an electric current distribution profile and an optical distribution profile to be equivalent, it is possible to improve a kink level, which is necessary for achieving a higher power. Further, by equalizing a top dimension and a bottom dimension of the ridge substantially, a thermal resistance at the time of current injection can be reduced, thereby achieving a low operating current.

However, in the case of a visible light semiconductor laser with an emission wavelength band of 650 nm, for example, in order to suppress the formation of a natural superlattice (an ordered structure) of a GaInP layer, a semiconductor substrate that is off-angled by about 10° in a [011] direction from a (100) plane is used in general. When the ridge-shaped stripe is formed using a wet etching technique, the ridge shape in the cross-section perpendicular to the longitudinal direction (stripe direction) of the ridge reflects the off-angle of the substrate and becomes right-left asymmetrical. Also, since a side etching amount of the cladding layer with respect to an etching mask is large in the wet etching, the ridge shape in the cross-section perpendicular to the longitudinal direction (stripe direction) of the ridge becomes a trapezoidal shape with its wall surfaces having low perpendicularity. From the above, it has been very difficult to solve the asymmetry of the ridge shape and improve the perpendicularity thereof in the cross-section perpendicular to the longitudinal direction (stripe direction) of the ridge.

In recent years, a technology has been suggested in which a ridge-shaped stripe is formed using both dry etching and wet etching, thus improving the perpendicularity and symmetry of the ridge shape in the cross-section perpendicular to the longitudinal direction (stripe direction) of the ridge (see Patent document 1 listed below, for example). Since the dry etching is capable of an anisotropic etching, it achieves a ridge shape having improved perpendicularity and symmetry in the cross-section perpendicular to the longitudinal direction (stripe direction) of the ridge compared with the case of forming the ridge-shaped stripe by wet etching alone. Also, by the wet etching after the dry etching, a damaged layer caused by plasma at the time of the dry etching is removed.

Moreover, in order to improve the perpendicularity and symmetry of the ridge shape in the cross-section perpendicular to the longitudinal direction (stripe direction) of the ridge, a technology of forming a ridge-shaped stripe by dry etching alone has been suggested (see Patent document 2 listed below, for example). This technology makes it possible to achieve a ridge shape having improved perpendicularity and symmetry in the cross-section perpendicular to the longitudinal direction (stripe direction) of the ridge compared with the case of forming the ridge-shaped stripe using both dry etching and wet etching.

Herein, a semiconductor laser device in the conventional technology illustrated in Examples 1 and 3 of Patent document 1 and a method for manufacturing the same will be described, with reference to FIGS. 3 and 4. FIG. 3 is a sectional view showing a structure of the semiconductor laser device described in Examples 1 and 3 of Patent document 1, and FIG. 4 is a sectional view showing its production processes, both viewed from a direction perpendicular to the longitudinal direction of the ridge-shaped stripe.

As shown in FIGS. 3 and 4(a), an n-type AlGaAs cladding layer 303, an active layer 304 with a quantum well structure, a p-type AlGaAs cladding layer 305, a p-type AlGaAs etching stop layer 306, a p-type AlGaAs cladding layer 307 and a p-type GaAs cap layer 309 are grown epitaxially in this order on an n-type GaAs substrate 301 by metal-organic chemical vapor deposition (in the following, referred to as MOCVD) (note that, in FIG. 4, layers corresponding to the n-type GaAs substrate 301, the n-type AlGaAs cladding layer 303 and the active layer 304 with the quantum well structure in FIG. 3 are omitted). Thereafter, photoresist is applied onto a surface of the p-type GaAs cap layer 309, and a ridge-shaped stripe pattern 313 of the photoresist is formed by a photolithography technique.

Here, in the case of producing an AlGaInP red semiconductor laser device, a p-type intermediate layer (for example, a p-type GaInP intermediate layer) is deposited between the p-type cladding layer 307 and the p-type GaAs cap layer 309 (not shown).

Although the ridge-shaped stripe pattern 313 is formed using the photoresist, it also may be formed using a dielectric material such as $SiO_2$.

Next, as shown in FIG. 4(b), the p-type GaAs cap layer 309 and the p-type cladding layer 307 are etched by a dry etching technique to a position 50 nm to 350 nm above the p-type etching stop layer 306 formed under the p-type cladding layer 307.

Then, as shown in FIG. 4(c), wet etching is carried out until the p-type etching stop layer 306 is reached, thus forming a ridge-shaped stripe formed of the p-type AlGaAs cladding layer 307 and the p-type GaAs cap layer 309.

Subsequently, as shown in FIG. 4(d), after removing the photoresist 313, an n-type current blocking layer 310 is deposited by MOCVD, and then the current blocking layer in a current injection region, namely, on a surface of the p-type GaAs cap layer 309 is removed by wet etching. Thereafter, a p-type GaAs contact layer 311 is formed by MOCVD again, thus completing a semiconductor laser wafer (see FIG. 3 for the completed product).

By the manufacturing method described above, the ridge shape with relatively improved perpendicularity and symmetry in the cross-section perpendicular to the longitudinal direction (stripe direction) of the ridge can be achieved for the AlGaAs infrared semiconductor laser device and the AlGaInP red semiconductor laser device. Also, with the wet etching, it is possible to control an etching depth and remove a layer damaged by plasma at the time of dry etching.

Next, a semiconductor laser device in the conventional technology illustrated in Example 2 of Patent document 1 described above and a method for manufacturing the same will be described, with reference to FIGS. 5 and 6. FIG. 5 is a sectional view showing a structure of the semiconductor laser device described in Example 2 of Patent document 1, and FIG. 6 is a sectional view showing its production processes, both viewed from a direction perpendicular to the longitudinal direction of the ridge-shaped stripe.

As shown in FIGS. 5 and 6(a), an n-type AlGaAs cladding layer 503, an active layer 504 with a quantum well structure, a p-type AlGaAs cladding layer 505, a p-type etching stop layer 506, a p-type AlGaAs cladding layer 507 and a p-type GaAs cap layer 509 are grown epitaxially in this order on an n-type GaAs substrate 501 by MOVPE (note that, in FIG. 6, layers corresponding to the n-type GaAs substrate 501, the n-type AlGaAs cladding layer 503 and the active layer 504 with the quantum well structure in FIG. 5 are omitted). Thereafter, a dielectric material such as $Al_2O_3$ is deposited onto a surface of the p-type GaAs cap layer 509, and a ridge-shaped stripe pattern 513 of the above-mentioned dielectric material such as $Al_2O_3$ is formed as a mask by a photolithography technique.

Here, the p-type etching stop layer 506 is an In-containing layer having a band gap that does not absorb a laser beam or an In-containing layer having a thickness designed for obtaining a quantum effect. For example, it is an AlGaInP layer or a GaInP layer.

Next, as shown in FIG. 6(b), the p-type AlGaAs cladding layer 507 and the p-type GaAs cap layer 509 are dry-etched until the p-type etching stop layer 506 is reached.

Since an inductively coupled plasma method (in the following, referred to as an ICP method) is used for the dry etching and the In-containing layer is used as the p-type etching stop layer 506, the etching rate in this layer considerably is lower than that in the p-type AlGaAs cladding layer 507 and the p-type GaAs cap layer 509. Thus, in the dry etching, the etching can be stopped in the etching stop layer 506.

Subsequently, as shown in FIG. 6(c), after removing the mask of the ridge-shaped stripe pattern 513 formed of the dielectric material such as $Al_2O_3$ described above with a chemical solution containing hydrofluoric acid as a principal component, a current blocking layer 510 is formed by MOCVD. Then, an unwanted portion of the current blocking layer 510 grown on the ridge-shaped stripe is removed by a photolithography technique using a photoresist, followed by forming a p-type GaAs contact layer 511 by metal-organic vapor-phase epitaxy (in the following, referred to as MOVPE), thus completing a semiconductor laser wafer (see FIG. 5 for the completed product).

In dry etching, since sputtering, which is a physical phenomenon, is a prime factor, it is difficult to secure a sufficiently large selectivity such as that achieving a sufficient difference in an etching speed between materials. However, using the etching stop layer containing In, the above-described manufacturing method secures a selectivity in the dry etching. In this manner, the ridge with high perpendicularity and high symmetry is formed by the dry etching alone.

Next, a semiconductor laser device in the conventional technology illustrated in Patent document 2 and a method for manufacturing the same will be described, with reference to FIGS. 7 and 8. FIG. 7 is a sectional view showing a structure of the semiconductor laser device described in Patent document 2, and FIG. 8 is a sectional view showing its production processes, both viewed from a direction perpendicular to the longitudinal direction of the ridge-shaped stripe.

As shown in FIGS. 7 and 8(a), an n-type $(Al_{0.7}Ga_{0.3})_{0.5}In_{0.5}P$ cladding layer 703, a GaInP/AlGaInP multiple quantum well active layer 704, a p-type $(Al_{0.7}Ga_{0.3})_{0.5}In_{0.5}P$ cladding layer 707, a p-type GaInP hetero buffer layer 708 and a p-type GaAs cap layer 709 are grown epitaxially in this order on an n-type GaAs substrate 702 by MOCVD. Thereafter, an $SiO_2$ film is formed on an entire surface of the substrate, and an $SiO_2$ stripe 713 is formed by a photolithography technique.

Next, as shown in FIG. 8(b), using the $SiO_2$ stripe 713 as a mask, the p-type GaAs cap layer 709, the p-type GaInP hetero buffer layer 708 and a part of the p-type $(Al_{0.7}Ga_{0.3})_{0.5}In_{0.5}P$ cladding layer 707 are etched by a dry etching technique, thus forming a ridge-shaped stripe.

Then, as shown in FIG. 8(c), using the $SiO_2$ stripe 713 as a mask, an n-type AlInP current blocking layer 705 and an n-type GaAs current blocking layer 706 are grown epitaxially in this order by MOCVD.

Subsequently, as shown in FIG. 8(d), the $SiO_2$ stripe 713 is removed, and a p-type GaAs contact layer 710 is grown on the entire surface of the substrate by MOCVD. Finally, a p-side electrode 711 and an n-side electrode 701 are formed, thus producing the semiconductor laser device.

By the manufacturing method described above, a ridge-shaped stripe can be formed by the dry etching alone, thus achieving a ridge shape with high symmetry and perpendicularity in the cross-section perpendicular to the longitudinal direction (stripe direction) of the ridge.

Patent document 1: JP 2003-69154A
Patent document 2: JP 2000-294877 A

DISCLOSURE OF INVENTION

Problem to be Solved by the Invention

In order to improve a kink level, it is desired that the ridge shape in the cross-section perpendicular to the longitudinal direction (stripe direction) of the ridge be right-left symmetrical when viewed such that the semiconductor substrate is on a lower side. This reduces the difference between a carrier distribution profile and an optical distribution profile, suppresses a hole burning phenomenon and solves instability in a transverse mode due to the asymmetry of the ridge shape in the cross-section perpendicular to the longitudinal direction (stripe direction) of the ridge.

Furthermore, in a high power semiconductor laser device, it is desired that a ridge lateral wall surface have a shape of a ridge-shaped stripe that is perpendicular to a surface of the semiconductor substrate and has a larger ridge height. When the ridge height is small, a laser beam dispersed from the active layer is absorbed by the p-type cap layer, etc., which tends to cause deterioration of characteristics such as an increase in a threshold current and a drop of a differential quantum efficiency. Since the width of a ridge bottom regulates not only the width of an electric current path but also the degree of light confinement, a ridge stripe semiconductor laser device usually is designed with reference to the width of the ridge bottom. When the perpendicularity of the ridge shape lowers, an increase in the ridge height while keeping the designed width of the ridge bottom narrows a top surface of the ridge. In other words, in the conventional process, a dimension of the ridge bottom remains the same, whereas a dimension of the ridge top is narrowed, thus forming a trapezoidal shape (a regular mesa shape). Consequently, the decrease in the dimension of the ridge top raises a contact resistance with the p-side electrode, so that characteristics such as a threshold current tend to lower. Thus, in a high power semiconductor laser with light dispersed widely from the active layer, in order to avoid these problems, it is required to form a ridge-shaped stripe whose ridge top surface does not narrow even when having a large ridge height.

Also, in order to improve reliability, it is desired that a layer damaged by plasma at the time of dry etching be removed. This is because, if the plasma damage remains in the substrate, a crystal defect is caused by heat generated at the time of operating the semiconductor laser, leading to deterioration of the element.

The manufacturing method described in Examples 1 and 3 of Patent document 1 shown in FIGS. 3 and 4 achieves the ridge shape with improved perpendicularity and symmetry in the cross-section perpendicular to the longitudinal direction (stripe direction) of the ridge compared with the case of the ridge formation by a wet etching technique alone. However, the wet etching aiming at controlling the etching depth and removing the plasma damaged layer causes side etching in the ridge top portion, so that the perpendicularity decreases. Especially in the AlGaInP red semiconductor laser device, a semiconductor substrate having an off-angle, more specifically, whose surface is a (100) plane tilted in a [011] direction, is used generally. This lowers the symmetry of the ridge shape in the cross-section perpendicular to the longitudinal direction (stripe direction) of the ridge, as shown in FIG. 4(*c*).

Also, in most cases, the wet etching chemical solution to be used only etches the p-type cladding layer 307 without etching the p-type GaAs cap layer 309. The p-type cladding layer 307 is formed of AlGaAs in the case of the AlGaAs infrared semiconductor laser device and formed of AlGaInP in the case of the AlGaInP red semiconductor laser device. Thus, as shown in FIG. 4(*c*), the ridge lateral surfaces of the p-type cladding layer 307 only are etched selectively, so that the upper portion of the p-type cladding layer 307 immediately under the p-type GaAs cap layer 309 becomes narrower than a desired ridge top dimension. Consequently, the p-type GaAs cap layer 309 protrudes on both sides of the ridge top portion, thus forming eave-like overhangs.

In the case of forming the n-type current blocking layer 310 on the substrate having such a ridge shape in the cross-section perpendicular to the longitudinal direction (stripe direction) of the ridge, the epitaxial growth is not completed immediately under the overhangs, so that cavities are formed. The cavities do not disappear even in the later processes and remain in the completed semiconductor laser device.

Since such cavities diffuse emission light in the laser device and thus cause a waveguide loss, they adversely affect the element characteristics, for example, reduce a differential quantum efficiency and increase a threshold current and an operating current.

Furthermore, in the manufacturing method described in Examples 1 and 3 of Patent document 1, for securing a certain ridge top dimension, an additional wet etching sufficient for exposing a stable crystal face cannot be performed. Thus, a single kind of the crystal face that is stable as, for example, a (100) plane is not exposed and plural kinds of the crystal faces are exposed to the ridge lateral wall surfaces in a skirt portion of the ridge, so that the ridge lateral wall surfaces become curved surfaces whose inclination angle varies continuously as a whole. Consequently, the ridge bottom dimension becomes larger than the mask dimension. Also, in the case of using the current blocking layer formed of a semiconductor layer such as an n-type AlInP semiconductor layer, when the current blocking layer is grown epitaxially, the crystallinity of the epitaxially-grown n-type AlInP current blocking layer lowers in the skirt portion of the ridge to which these plural kinds of the crystal faces are exposed. The increase in the ridge dimension relative to the mask dimension and the drop of the crystallinity of the n-type AlInP current blocking layer described above deteriorate the element characteristics, for example, reduce the uniformity of a horizontal radiation angle of the laser beam and increase the threshold current and the operating current.

Also, in the manufacturing method described in Examples 1 and 3 of Patent document 1, since the wet etching speed varies considerably along a wafer surface and among wafer surfaces, it is difficult to achieve the uniformity of the ridge dimensions in the case of producing a plurality of semiconductor laser devices in a single wafer surface and further among a plurality of wafers, thus causing a lower yield.

Next, in the manufacturing method described in Example 2 of Patent document 1 shown in FIGS. 5 and 6, since the ridge is formed by the dry etching alone, it is possible to achieve the ridge shape with high perpendicularity and high symmetry. Further, the use of the etching stop layer containing In brings about improved controllability of the etching depth.

However, the layer damaged by plasma at the time of the dry etching is not removed, and thus, a problem of early element deterioration due to the remaining plasma damage is not solved. Also, when using a dielectric film of SiN, $SiO_2$ or the like as the current blocking layer, an increase in the angle that the ridge lateral surfaces form with the substrate surface results in an undersupply of a material gas for forming the dielectric film of SiN, $SiO_2$ or the like in the skirt portion of the ridge by plasma CVD or the like, so that a film forming speed decreases locally. This reduces the coverage of the current blocking layer in the skirt portion of the ridge. On the other hand, when using a semiconductor layer such as the n-type AlInP semiconductor layer as the current blocking layer, since plural kinds of the crystal faces are exposed to the ridge lateral surfaces formed by the anisotropic dry etching, the epitaxial growth cannot be carried out with excellent crystallinity, thus lowering the crystallinity of the current blocking layer. The decrease in the coverage of the SiN current blocking layer in the skirt portion of the ridge, which is close to an emission position and most influential on the emission light, and the drop of the crystallinity of the n-type AlInP current blocking layer described above lead to deterioration of the element characteristics, for example, reduce the uniformity of a horizontal radiation angle of the laser beam and increase the threshold current and the operating current.

Furthermore, when there is stress between the current blocking layer and the semiconductor substrate, in the case where the angle that the ridge lateral surfaces form with the substrate surface is close to 90° in a lower end of the ridge, stress concentrates near joint lines of the ridge lateral surfaces and the etching stop layer due to an impact applied at the time of cleaving a laser chip. Then, the skirt portion of the ridge sometimes cracks from this part. Accompanying this, the performance of the laser element may decrease.

The above-described manufacturing method is limited to an AlGaAs infrared semiconductor laser device and not applicable to an AlGaInP red semiconductor laser device. Also, in the case where a thin film GaInP etching stop layer is crystal-grown on the AlGaAs cladding layer, there arise problems of the controllability of composition, film thickness and lattice mismatch and the drop of the crystallinity, making stable production difficult.

Now, in the manufacturing method described in Patent document 2 illustrated in FIGS. 7 and 8, although the ridge shape with high perpendicularity and high symmetry in the cross-section perpendicular to the longitudinal direction (stripe direction) of the ridge is achieved by the dry etching alone, a layer damaged by plasma at the time of the dry etching is not removed.

Also, since no etching stop layer is provided, the dry etching depth cannot be controlled. For example, in the case of fabricating a plurality of semiconductor laser devices in a wafer surface or among a plurality of wafers on which the semiconductor laser devices are formed, the uniformity of the ridge height among the individual semiconductor laser devices is decreased.

Furthermore, similarly to Example 2 of Patent document 1, when using a dielectric film of SiN, $SiO_2$ or the like as the current blocking layer, an increase in the angle that the ridge lateral wall surfaces form with the substrate surface results in an undersupply of a material gas for forming the dielectric film of SiN, $SiO_2$ or the like in the skirt portion of the ridge by plasma CVD or the like as described above, so that a film forming speed decreases locally. This reduces the coverage of the current blocking layer in the skirt portion of the ridge, so that an electric current may leak in the skirt portion of the ridge. In the case of using a semiconductor layer such as the n-type AlInP semiconductor layer as the current blocking layer, since plural crystal faces are exposed to the ridge lateral wall surfaces formed by the anisotropic dry etching, the epitaxial growth cannot be carried out with excellent crystallinity, thus lowering the crystallinity of the current blocking layer.

Also, similarly to Example 2 of Patent document 1, since the angle that the ridge lateral wall surfaces form with the substrate surface is large, the skirt portion of the ridge may crack.

In view of the conventional problems described above, it is an object of the present invention to provide a ridge stripe semiconductor laser device that achieves a ridge formation with excellent perpendicularity and excellent symmetry, a high kink level and an improved output and a method for manufacturing the same. In particular, in a method for forming a ridge-shaped stripe using both dry etching and wet etching, by forming lateral wall protective layers on post-dry etching ridge lateral wall surfaces so as to suppress side etching of a ridge top at the time of the subsequent wet etching, the present invention succeeded in achieving the ridge formation with high perpendicularity and high symmetry without a layer damaged by plasma at the time of the dry etching. Also, the object of the present invention is to provide a ridge stripe semiconductor laser device that achieves a ridge formation with excellent perpendicularity and excellent symmetry, a high kink level and an improved output and a method for manufacturing the same by reducing the number of crystal faces to be exposed to a skirt portion of a ridge at the time of wet etching so as to form a substantially linear inclined surfaces, thus forming a ridge with small variation in dimension in a stable manner, improving coverage in a skirt portion of the ridge in a current blocking layer formed of a dielectric film of SiN, $SiO_2$ or the like and improving crystallinity in the skirt portion of the ridge in the current blocking layer formed of a semiconductor layer of n-type AlInP or the like. It is a further object of the present invention to provide a manufacturing method that achieves a uniform ridge dimension without variation among semiconductor laser devices to be formed in the case of producing a plurality of the semiconductor laser devices on a single wafer surface and further among a plurality of wafers by adjusting the thickness of lateral wall protective layers formed on ridge lateral wall surfaces and the amount of side etching at the time of wet etching.

Means for Solving Problem

In order to achieve the above-mentioned objects, a ridge stripe semiconductor laser device according to the present invention includes a first conductivity type cladding layer, an active layer, a second conductivity type first cladding layer, an etching stop layer, a second conductivity type second cladding layer formed as a stripe-shaped ridge, and a current blocking layer formed in a region except for at least a part on the ridge that are disposed on a compound semiconductor substrate. In a cross-section perpendicular to a stripe direction of the ridge, each of both lateral surfaces of the ridge includes a first surface that is substantially perpendicular to a surface of the semiconductor substrate and extends downward from an upper end of the ridge, and a second surface that is formed of a substantially linear skirt portion inclined surface that is inclined obliquely downward to an outside of the ridge in a skirt portion of the ridge. The first surface and the second surface are (a) connected directly, or (b) connected via a third intermediate surface. The third intermediate surface is (b1) a substantially linear step surface that protrudes toward the outside of the ridge, is substantially parallel with the surface of the semiconductor substrate and has a length not greater than 0.2 μm in the cross-section, or (b2) an inclined intermediate surface that protrudes obliquely downward to the outside of the ridge and has a linear shape or a curved shape that is convex toward an inside of the ridge. A (111) plane of a semiconductor constituting the second cladding layer is exposed to the second surface.

Here, each of the first surface and the second surface has a substantially linear shape in the ridge lateral surface. In other words, each of these two inclined surfaces is an inclined surface formed of a substantially flat surface. In the case where the first surface and the second surface are connected directly, the connection portion between these two surfaces has a bent point in the cross-section. In the cases where the first surface and the second surface are connected via the intermediate surface serving as the third surface (in this case, a step surface) as in (b1) noted above and where the third surface is the inclined surface that has the linear shape as in (b2) noted above, the respective connection portions have a bent point in the cross-section. Also, in the case where the third surface has the curved shape as in (b2) noted above, the first surface and the second surface are linear flat surfaces. Thus, a curved surface with its inclined surface having an inclination changing continuously overall, for example, a curved surface whose cross-section is a continuous curve such as the lateral wall surfaces of the cladding layer 307 shown in FIGS. 4(*c*) and (*d*) is excluded.

In the above-described ridge stripe semiconductor laser device according to the present invention, it is preferable that the (111) plane is exposed in at least 50% of an area of the second surface. This is preferable because the current blocking layer, etc. can be grown epitaxially with excellent crystallinity.

Also, in the ridge stripe semiconductor laser device according to the present invention, it is preferable that in the cross-section perpendicular to the stripe direction of the ridge, an angle that the first surface forms with the surface of the semiconductor substrate is 85° to 95°. In this way, in the cross-section perpendicular to the stripe direction of the ridge, the width of the ridge near its upper end portion is not made excessively smaller than the width of the ridge near its lower end portion in the first surface. Accordingly, it is possible to prevent a contact resistance with the p-side electrode from rising and characteristics such as a threshold from lowering. Also, the ridge height can be increased, thus preventing an increase in a threshold current and a drop of a differential quantum efficiency, making it possible to achieve a high power semiconductor laser with light dispersed widely from the active layer, which is preferable.

Further, in the ridge stripe semiconductor laser device according to the present invention, it is preferable that in the cross-section perpendicular to the stripe direction of the ridge, in the case where the third intermediate surface has the step surface that protrudes toward the outside of the ridge as in (b1) noted above, the length of the step surface that is substantially parallel with the surface of the semiconductor substrate is not greater than a thickness of the current blocking layer. This is preferable because, even when a method with poor coverage, for example, sputtering is used at the time of forming the current blocking layer, the coverage of the current blocking layer in the skirt portion of the ridge does not decrease considerably, thus preventing an electric current from leaking out from this portion.

Moreover, in the ridge stripe semiconductor laser device according to the present invention, it is preferable that an orientation of the surface of the semiconductor substrate is tilted by a predetermined angle from a (100) plane. Also, in this case, it is particularly preferable that the (100) plane is tilted in a [011] direction.

This is preferable because the formation of a natural superlattice can be suppressed.

Incidentally, the predetermined angle means an angle at which no natural superlattice is formed at the time of growing the first cladding layer on the semiconductor substrate epitaxially (growing such that its crystal axis is aligned with the crystal axis of the substrate), and it usually is preferable that this angle is 5° to 20°.

Next, a method for manufacturing a ridge stripe semiconductor laser device according to the present invention includes forming a first conductivity type cladding layer, an active layer, a second conductivity type first cladding layer, an etching stop layer and a second conductivity type second cladding layer in this order on a compound semiconductor substrate, etching the second conductivity type second cladding layer midway through it except for a portion forming a stripe-shaped ridge using a dry etching technique, forming at least one lateral wall protective layer on lateral surfaces of the ridge formed by the dry etching, etching the second conductivity type second cladding layer further until the etching stop layer is reached using a wet etching technique so as to form the stripe-shaped ridge having the ridge lateral surfaces formed by the dry etching and ridge lateral surfaces formed by the wet etching, removing the lateral wall protective layer, and forming a current blocking layer in a region except for at least a part on the ridge. In the wet etching, the second cladding layer is etched so that a (111) plane of a semiconductor constituting the second cladding layer is exposed to at least a part of the ridge lateral surfaces.

In the above-described method for manufacturing a ridge stripe semiconductor laser device according to the present invention, it is preferable that in the wet etching, the (111) plane is exposed in at least 50% of an area of the ridge lateral surfaces formed by the wet etching.

In this case, the (111) plane is exposed in at least 50% of the area, whereby a side etching speed in the wet etching becomes decreased and stabilized. This suppress the variation of the etching speed due to the variation of the concentration and temperature of the chemical solution used for the wet etching, making it easier to control the shape of the skirt portion of the ridge, which is preferable.

Incidentally, in this case, it is preferable to carry out the wet etching until the second surface becomes substantially linear in the cross-section because the (111) plane is exposed to substantially the entire surface of the second surface.

Also, in the method for manufacturing a ridge stripe semiconductor laser device according to the present invention, it is preferable that in a cross-section perpendicular to a stripe direction of the ridge, (thickness of the lateral wall protective layer)≧(side etching amount of the second conductivity type second cladding layer in the wet etching). The above definition is preferable because an increase in the resistance due to an electric current path narrowed by etching the ridge inner portion at the time of the wet etching can be prevented, thereby making it possible to achieve a high power semiconductor laser device with light dispersed widely from the active layer.

Further, in the method for manufacturing a ridge stripe semiconductor laser device according to the present invention, it is preferable that an orientation of the surface of the semiconductor substrate is tilted by a predetermined angle from a (100) plane. In this case, it is particularly preferable that the (100) plane is tilted in a [011] direction.

This is preferable because the formation of a natural superlattice can be suppressed.

Incidentally, the predetermined angle means an angle at which no natural superlattice is formed at the time of growing the first cladding layer on the semiconductor substrate epitaxially (growing such that its crystal axis is aligned with the crystal axis of the substrate), and it usually is preferable that this angle is 5° to 20°. The reason will be described below by taking as an example the case where an AlGaInP semiconductor layer (a mixed crystal semiconductor of AlP, GaP and InP) is grown epitaxially on a GaAs(100) substrate. A natural superlattice, which is a periodic layered structure of GaP (AlP) and InP in this case, is formed. When the natural superlattice is formed, an energy gap decreases compared with a usual state, causing a problem that the emission wavelength of a red laser beam varies from 650 nm to 685 nm, for example. Further, although the energy gap in the mixed crystal semiconductor can be changed accordingly by changing the composition ratio of components constituting the semiconductor, the change in the energy gap due to the crystal structure becomes dominant when the natural superlattice structure is formed. This brings about a disadvantage that, even by changing the composition ratio, it is not possible to achieve a desired energy gap value, in other words, a desired emission wavelength. Therefore, in order to prevent the formation of the natural superlattice, it is particularly preferable to use the semiconductor substrate whose surface is tilted by the predetermined angle from the (100) plane in the [011] direction.

Moreover, a method for manufacturing a ridge stripe semiconductor laser device according to the present invention includes forming a first conductivity type cladding layer, an active layer, a second conductivity type first cladding layer, an etching stop layer and a second conductivity type second cladding layer in this order on a compound semiconductor substrate whose surface has an orientation tilted by a predetermined angle from a (100) plane, etching the second conductivity type second cladding layer midway through it except for a portion forming a stripe-shaped ridge using a dry etching technique, forming at least one lateral wall protective layer whose thickness is different on both sides of the ridge on lateral surfaces of the ridge in a ridge portion formed by the dry etching, etching the second conductivity type second cladding layer further until the etching stop layer is reached using a wet etching technique so as to form the stripe-shaped ridge having the ridge lateral surfaces formed by the dry etching and ridge lateral surfaces formed by the wet etching, removing the lateral wall protective layer, and forming a current blocking layer in a region except for at least a part on the ridge.

This is preferable because the use of the compound semiconductor substrate whose surface has an orientation tilted by a predetermined angle from a (100) plane as above makes it possible to suppress the formation of natural superlattice.

Also, in the above-described method for manufacturing a ridge stripe semiconductor laser device, it is preferable that when the ridge is viewed from a [01-1] direction with the substrate facing downward in a cross-section perpendicular to a stripe direction of the ridge, the lateral wall protective layer formed on a right side of the ridge out of two of the lateral wall protective layers formed on the both sides of the ridge is thinner than the lateral wall protective layer formed on a left side of the ridge.

According to these methods, even when using an off-angled substrate, by reducing the size of the intermediate step surfaces and suitably adjusting the thickness of the lateral wall protective layers on the both sides of the ridge suitably to be the thickness equal to the side etching amount by the wet etching on the respective sides, the ridge stripe without any intermediate step surfaces can be formed. As a result, the change in the refractive index generated near the connection portion between the intermediate step surfaces and the second surfaces is suppressed, so that the disturbance of the distribution of a laser beam guided in the resonator (Near Field Pattern; in the following, abbreviated as NFP) is small, making it possible to produce a ridge stripe semiconductor laser device that has a stable radiation shape of the laser beam, which is preferable.

Further, in the above-described method for manufacturing a ridge stripe semiconductor laser device, it is preferable that in the wet etching, the second cladding layer is etched so that a (111) plane of a semiconductor constituting the second cladding layer is exposed to at least a part of the ridge lateral surfaces.

In this case, the (111) plane is exposed, whereby a side etching speed in the wet etching comes to decrease and stabilize. This suppress the variation of the etching speed due to the variation of the concentration and temperature of the chemical solution used for the wet etching, making it easier to control the shape of the skirt portion of the ridge, which is preferable.

Moreover, in the above-described method for manufacturing a ridge stripe semiconductor laser device, it is preferable that in the wet etching, the (111) plane is exposed in at least 50% of an area of the ridge lateral surfaces formed by the wet etching.

In this case, the (111) plane is exposed in at least 50% of the area, whereby a side etching speed in the wet etching comes to decrease and stabilize. This suppress the variation of the etching speed due to the variation of the concentration and temperature of the chemical solution used for the wet etching, making it easier to control the shape of the skirt portion of the ridge, which is preferable.

Additionally, in the above-described method for manufacturing a ridge stripe semiconductor laser device, it is preferable that in the cross-section perpendicular to the stripe direction of the ridge, (thickness of the thinner lateral wall protective layer of the two)≧(side etching amount of the second conductivity type second cladding layer in the wet etching).

In this manner, it is possible either to form a shape of the substantially linear step surface that protrudes toward the outside of the ridge and is substantially parallel with the surface of the semiconductor substrate stably in a wafer surface or to form a shape in which the third surface is not formed on the ridge lateral wall surface on the side of the thinner layer of the above-noted lateral wall protective layers (a shape in which the first surface and the second surface are connected directly) stably in a wafer surface. In other words, it is possible to prevent the formation of a shape in which the substantially linear step surface dents toward the inside of the ridge, which is preferable. With the shape in which the step surface dents toward the inside of the ridge, in particular, a constriction is formed in the ridge, whereby the electric current path is narrowed, thus increasing the resistance at the time of operating the laser. Thus, the deterioration of characteristics such as an increase in a threshold becomes likely to occur.

Further, in the above-described method for manufacturing a ridge stripe semiconductor laser device, it is preferable that the (100) plane is tilted in a [011] direction.

This is preferable because the formation of a natural superlattice can be suppressed.

Effects of the Invention

According to the present invention described above, it is possible to provide a ridge stripe semiconductor laser device that achieves improved element characteristics such as a uniform horizontal radiation angle of a laser beam, an improved differential quantum efficiency and an improved kink level, and a method for manufacturing the same. Further, a ridge-shaped stripe can be formed with excellent uniformity on a wafer surface and between wafers, thus allowing a yield improvement.

Figure 1:
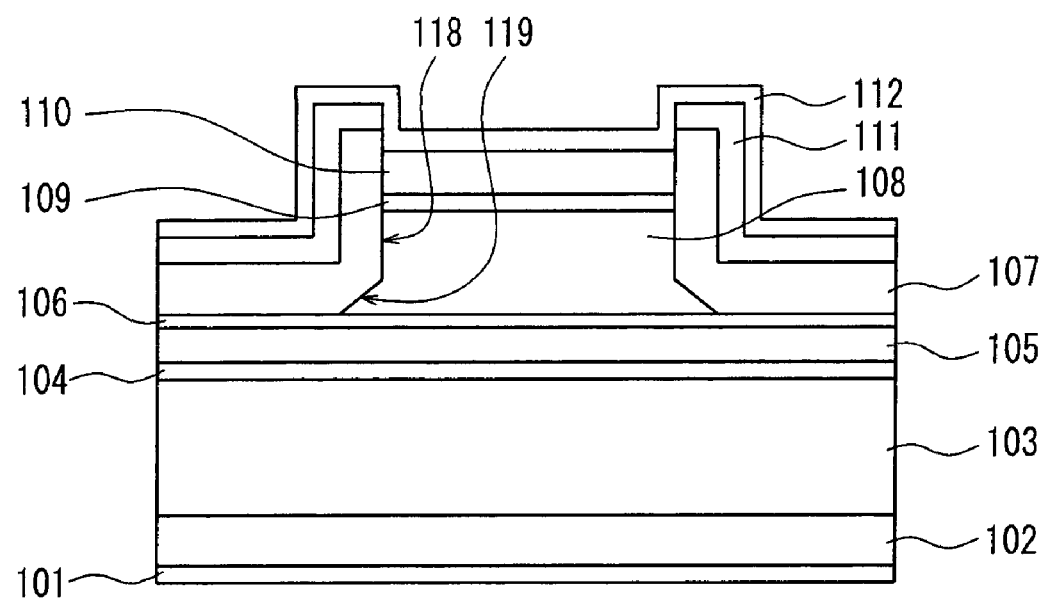
FIG. 1 is a sectional view showing a structure of an embodiment of a ridge stripe semiconductor laser device according to the present invention.

EXPLANATION OF LETTERS OR NUMERALS 101 n-side electrode
102 n-type GaAs substrate
103 n-type $(Al_{0.7}Ga_{0.3})_{0.5}In_{0.5}P$ cladding layer
104 $Ga_{0.5}In_{0.5}P$ active layer
105 p-type $(Al_{0.7}Ga_{0.3})_{0.5}In_{0.5}P$ first cladding layer
106 p-type $Ga_{0.5}In_{0.5}P$ etching stop layer
107 n-type $Al_{0.5}In_{0.5}P$ current blocking layer
108 p-type $(Al^{0.7}Ga_{0.3})_{0.5}In_{0.5}P$ second cladding layer
109 p-type $Ga_{0.5}In_{0.5}P$ intermediate layer
110 p-type GaAs contact layer
111 n-type GaAs cap layer
112 p-side electrode
113 $SiO_2$ film
114 $SiO_2$ stripe
115 $SiO_2$ film
116 $SiO_2$ lateral wall protective layer
116α $SiO_2$ lateral wall protective layer
116β $SiO_2$ lateral wall protective layer
116γ $SiO_2$ lateral wall protective layer
117 step surface
118 first ridge lateral wall surface
119 second ridge lateral wall surface
120 angle that ridge lateral surface forms with semiconductor substrate surface
121 first post-dry etching lateral wall surface
122 post-dry etching bottom surface
123 third post-dry etching lateral wall surface (flat shape)
124 third post-dry etching lateral wall surface (curved shape)
125 region near skirt portion of ridge
126 region near skirt portion of ridge
127 region near skirt portion of ridge
128 $SiO_2$ film
129 $SiO_2$ film
130 $SiO_2$ lateral wall protective layer
131 $SiO_2$ lateral wall protective layer
132 region near skirt portion of ridge
133 region near skirt portion of ridge
134 step
135 second ridge lateral wall surface
136 step
137 step
138 n-type AlInP current blocking layer
139 n-type GaAs cap layer
140 p-side electrode
141 n-side electrode
142 inclined intermediate surface
145 resist pattern
146 first ridge lateral wall surface
147 second ridge lateral wall surface
148 n-type $Al_{0.5}In_{0.5}P$ current blocking layer
149 n-type GaAs cap layer
150 p-side electrode
151 n-side electrode
152 third intermediate step surface
301 n-type GaAs substrate
303 n-type cladding layer
304 active layer with quantum well structure
305 p-type first cladding layer
306 p-type etching stop layer
307 p-type cladding layer
309 p-type GaAs cap layer
310 n-type current blocking layer
311 p-type GaAs contact layer
313 ridge-shaped stripe pattern
501 n-type GaAs substrate
503 n-type AlGaAs cladding layer
504 active layer with quantum well structure
505 p-type AlGaAs cladding layer
506 p-type etching stop layer
507 p-type AlGaAs cladding layer
509 p-type GaAs cap layer
510 current blocking layer
511 p-type GaAs contact layer
513 ridge-shaped stripe pattern
514 SiN current blocking layer
701 n-side electrode
702 n-type GaAs substrate
703 n-type $(Al_{0.7}Ga_{0.3})_{0.5}In_{0.5}P$ cladding layer
704 GaInP/AlGaInP multiple quantum well active layer
705 n-type AlInP current blocking layer
706 n-type GaAs blocking layer
707 p-type $(Al_{0.7}Ga_{0.3})_{0.5}P$ cladding layer
708 p-type GaInP hetero buffer layer
709 p-type GaAs cap layer
710 p-type GaAs contact layer
711 p-side electrode
713 $SiO_2$ stripe

DESCRIPTION OF THE INVENTION

In the following, embodiments of the present invention will be described in detail using an AlGaInP ridge stripe red semiconductor laser device, with reference to the accompanying drawings. It should be noted that the following embodiments do not limit the present invention but are merely an illustration for facilitating understanding of the present invention.

The present invention can be applied to any ridge stripe semiconductor laser devices.

Embodiment 1

Figure 2A:
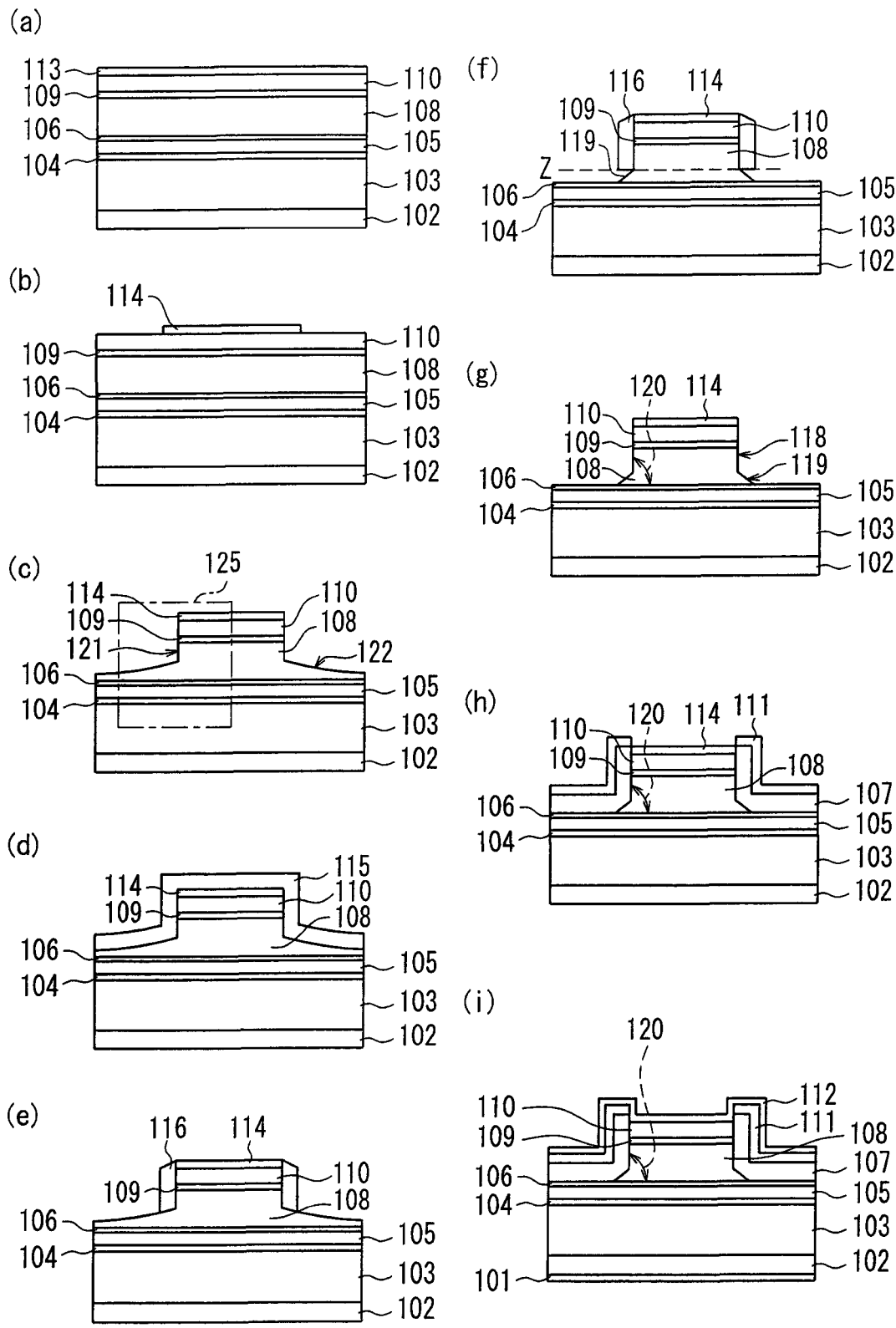
FIG. 2A is a sectional view showing manufacturing processes of the ridge stripe semiconductor laser device according to the present invention shown in FIG. 1.

FIG. 1 is a sectional view showing a ridge stripe semiconductor laser device in Embodiment 1 of the present invention taken along a direction perpendicular to a stripe longitudinal direction of the ridge, and FIG. 2A is a sectional view showing manufacturing processes of the same. In the description of the semiconductor laser device in the present invention, upward/downward and an upper side/a lower side of the semiconductor laser device are defined as follows: referring to FIG. 1, for example, a side on which an n-side electrode 101 is present is called downward or a lower side, and a side on which a p-side electrode 112 is present is called upward or an upper side. A similar definition applies to other figures. Upward in each figure is called upward or an upper side in the description of the semiconductor laser device, and downward in each figure is called downward or a lower side. Further, unless otherwise specified, the other figures are all sectional views taken along the direction perpendicular to the stripe longitudinal direction of the ridge.

First, as shown in FIGS. 1 and 2A(a), an n-type $(Al_{0.7}Ga_{0.3})_{0.5}In_{0.5}P$ cladding layer 103 (with a thickness of 1 to 2 μm), a $Ga_{0.5}In_{0.5}P$ active layer 104 (with a thickness of 5 to 6 nm), a p-type $(Al_{0.7}Ga_{0.3})_{0.5}In_{0.5}P$ first cladding layer 105 (with a thickness of 0.1 to 0.3 μm), a p-type $Ga_{0.5}In_{0.5}P$ etching stop layer 106 (with a thickness of 8 to 12 nm), a p-type $(Al_{0.7}Ga_{0.3})_{0.5}In_{0.5}P$ second cladding layer 108 (with a thickness of 0.9 to 1.7 μm), a p-type $Ga_{0.5}In_{0.5}P$ intermediate layer 109 (with a thickness of 40 to 60 nm) and a p-type GaAs contact layer 110 (with a thickness of 0.1 to 0.3 μm) are formed in this order on an n-type GaAs substrate 102 (with a thickness of 400 to 500 μm) by MOCVD (metal-organic chemical vapor deposition). Next, an $SiO_2$ film 113 (with a thickness of 0.2 to 0.6 μm) is formed on the p-type GaAs contact layer 110 by sputtering.

Incidentally, in the case of a visible light semiconductor laser with an emission wavelength band of 650 nm, for example, in order to suppress the formation of a natural superlattice (an ordered structure) of a $Ga_{0.5}In_{0.5}P$ layer, the n-type GaAs substrate 102 to be used in general is a so-called off-angled semiconductor substrate whose surface is a (100) plane tilted by about 10° in a [011] direction. However, in the present invention, the off-angle of the substrate is not particularly limited. In other words, in the present invention, even if the substrate is off-angled, a right-left symmetry of a ridge shape substantially is maintained in a cross-section perpendicular to a stripe direction of a ridge as described later, and a current blocking layer can be formed without causing any problems as described later.

Also, the active layer 104 may be an active layer with a multiple quantum well structure having GaInP as a well layer and AlGaInP as a barrier layer.

Further, the p-type $Ga_{0.5}In_{0.5}P$ etching stop layer 106 also may be an etching stop layer with a multiple quantum well structure having GaInP as a well layer and AlGaInP as a barrier layer.

In this case, it is appropriate that the p-type $Ga_{0.5}In_{0.5}P$ etching stop layer 106 is a layer having a band gap that does not absorb a laser beam or a layer having a thickness designed for obtaining a quantum effect. For example, an AlGaInP layer may be used.

Next, as shown in FIG. 2A(b), an $SiO_2$ film 113 shown in FIG. 2A(a) is formed into an $SiO_2$ stripe 114 by a photolithography technique and a dry etching technique.

Subsequently, as shown in FIG. 2A(c), using the $SiO_2$ stripe 114 as a mask, the p-type $(Al_{0.7}Ga_{0.3})_{0.5}In_{0.5}P$ second cladding layer 108, the p-type $Ga_{0.5}In_{0.5}P$ intermediate layer 109 and the p-type GaAs contact layer 110 are dry-etched midway through the p-type $(Al_{0.7}Ga_{0.3})_{0.5}In_{0.5}P$ second cladding layer 108.

Here, an amount of the dry etching ranges from 65% to 95%, preferably from 80% to 95%, of a ridge height. Within this range, it is possible to suppress variation of an amount of side etching caused by wet etching in a skirt portion of the ridge described later. This is because, in the case where a region of a first surface formed by the dry etching is too small and thus a region to be wet-etched is too large, the etching amount varies considerably depending on a state (concentration, temperature, etc.) of an etchant, so that the influence of a crystal face described later becomes less dominant. Herein, the above-described numerical range of the amount of dry etching and the ridge height indicates the relationship between the dry etching amount and the ridge height in a ridge lateral surface portion. In other words, as shown in FIG. 2A(c), in general, a portion of the remaining second cladding layer 108 located outside the ridge (in other words, a portion in a skirt portion extending transversely) often tends to be thinner in a portion away from the ridge lateral surface portion than in a portion near the ridge lateral surface portion. Accordingly, in the case of setting the dry etching amount to be in the range of 65% to 95% of the ridge height, a vertical distance from an upper end of a first post-dry etching lateral wall surface 121 to a lower end thereof (a portion contacting a post-dry etching bottom surface 122) serves as a reference ridge height.

Also, the method for obtaining such a desired dry etching amount can be a method in which the etching is stopped by time control or a method in which monochromatic light is illuminated on a substrate surface, the etching is carried out while calculating a remaining thickness to be etched from the relationship between an interference intensity obtained by the reflected light and a time, and the etching is stopped when a desired thickness is reached.

In the present invention, as the dry etching technique described above, any technique can be adopted in a preferred manner as long as it is an anisotropic plasma etching. Examples of the dry etching include a method using inductively coupled plasma (in the following, referred to as ICP), a method using electron cyclotron resonance (in the following, referred to as ECR) plasma, and the like. Also, an etching gas can be a mixed gas of $SiCl_4$ and Ar and the like. The $SiCl_4$ gas component may be replaced by chlorine gas or boron trichloride gas.

It should be noted that the dry etching technique used in Embodiment 1 is the ICP (inductively coupled plasma) method using a mixed gas of $SiCl_4$ and Ar as the etching gas. As the etching condition, the content of $SiCl_4$ in the mixed gas is 5% to 12% by volume, the temperature of a lower electrode provided with the semiconductor substrate is 150° C. to 200° C., the pressure inside a chamber is 0.1 to 1 Pa, the bias power of the lower electrode is 50 to 150 W, and the ICP power is 200 to 300 W. However, there is no particular limitation to them, and the etching condition may be selected suitably.

Next, as shown in FIG. 2A(d), an $SiO_2$ film 115 with a thickness of 60 nm to 400 nm is grown on an entire surface (including ridge lateral surfaces) of an intermediate obtained in FIG. 2A(c) by plasma CVD.

Although the SiO$_2$ film 115 with a thickness of 60 nm to 400 nm is grown for the purpose of forming ridge lateral wall protective layers in Embodiment 1, the thickness of the SiO$_2$ film 115 is not limited to this. In order to remove the SiO$_2$ film 115 in a region other than the ridge lateral wall surfaces in the subsequent process, the thickness of the SiO$_2$ film 115 may be selected suitably according to the amount of side etching caused by an additional dry etching or the amount of etching at the time of wet etching using a hydrofluoric acid-based chemical solution carried out suitably for a surface treatment in each process, without any particular limitation.

Further, the SiO$_2$ film 115 used in Embodiment 1 is not limited to this. As a material that can be used for the lateral wall protective layer, it is appropriate to use a material having properties of being able to secure a high selectivity relative to a wet etching chemical solution used in the later process (a resistance to the etching chemical solution), forming no intermediate product with the AlGaInP semiconductor layer and having a high controllability of the film thickness at the time of forming the film. Specific examples thereof can include not only the SiO$_2$ film but also films capable of serving as the ridge lateral wall protective layer suitably such as a dielectric film of SiN, Al$_2$O$_3$ or the like, a semiconductor layer of GaAs, AlGaAs or the like, a metal film and an organic film that have the above-described properties.

Examples of a means of forming these films can include CVDs (for example, plasma CVD, atmospheric pressure CVD, MOCVD and the like) and PVDs (sputtering, vacuum evaporation and the like). In the present embodiment, the plasma CVD is particularly preferable because it can form films with high thickness uniformity easily. Incidentally, CVD stands for chemical vapor deposition, and PVD stands for physical vapor deposition.

Although the SiO$_2$ film 115 used in Embodiment 1 is a single layer, it also may include a plurality of layers as necessary, without any particular limitation.

Subsequently, as shown in FIG. 2A(e), the SiO$_2$ film 115 in the region other than the ridge lateral wall surfaces is removed by dry etching, thus forming SiO$_2$ lateral wall protective layers 116.

As the dry etching, it is possible to employ dry etching capable of removing the SiO$_2$ film 115 in the region other than the ridge lateral surfaces suitably, for example, reactive ion etching (in the following, referred to as RIE), ICP, ECR or the like. Also, a CF-based gas such as a mixed gas of CF$_4$ and CHF$_3$ is used as the etching gas.

In Embodiment 1, RIE is employed, and the mixed gas of CF$_4$, CHF$_3$ and O$_2$ is used as the etching gas. Further, as the condition for the dry etching, the contents of CF$_4$ and CHF$_3$ in the mixed gas respectively are 1% to 10% and 30% to 50% by volume, the pressure is 40 to 60 Pa, and the stage temperature is 10° C. to 20° C. However, there is no particular limitation to them, and the condition can be changed suitably.

Next, as shown in FIG. 2A(f), using hydrochloric acid-based chemical solution, which is a mixture solution of tartaric acid, hydrochloric acid and water (the tartaric acid content in the chemical solution is 30% to 50% by volume, and the hydrochloric acid content therein is 15% to 35% by volume), the p-type (Al$_{0.7}$Ga$_{0.3}$)$_{0.5}$In$_{0.5}$P second cladding layer 108 is etched until the p-type Ga$_{0.5}$In$_{0.5}$P etching stop layer 106 is reached. Here, since the p-type Ga$_{0.5}$In$_{0.5}$P etching stop layer 106 is resistant to the hydrochloric acid-based chemical solution, the etching in a direction perpendicular to the substrate surface stops when this layer is exposed.

Whether the wet etching in the direction perpendicular to the substrate surface has stopped can be judged by visual observation of an interference pattern in the etching region on the surface of the semiconductor substrate. When the p-type Ga$_{0.5}$In$_{0.5}$P etching stop layer 106 is exposed, the etching speed in the direction perpendicular to the substrate surface drops precipitously, so that the uniformity of the film thickness on the substrate surface improves. Consequently, the interference pattern in the etching region stops changing. In this way, it is possible to determine that the etching in the direction perpendicular to the substrate surface has stopped.

Although Embodiment 1 uses the hydrochloric acid-based chemical solution as the chemical solution for wet-etching the p-type (Al$_{0.7}$Ga$_{0.3}$)$_{0.5}$In$_{0.5}$P second cladding layer 108, there is no particular limitation to this. Any chemical solution may be used as long as it has a high selectivity relative to the SiO$_2$ lateral wall protective layers 116 and the p-type Ga$_{0.5}$In$_{0.5}$P etching stop layer 106, and a sulfuric acid-based chemical solution may be used, for example.

Here, since the SiO$_2$ lateral wall protective layers 116 are highly resistant to the hydrochloric acid-based chemical solution, regions provided with these layers on the ridge lateral surfaces are not etched, so that no side etching occurs in top portions of the ridge lateral surfaces (that is, portions to be first surfaces).

On the other hand, as shown in FIG. 2A(f), the regions without the SiO$_2$ lateral wall protective layers 116 on the ridge lateral surfaces (a skirt portion of the ridge) are etched isotropically.

Here, immediately after the wet etching in the direction perpendicular to the substrate surface stops, the ridge lateral surfaces in the regions without the SiO$_2$ lateral wall protective layer 116 have a curved inclined surface in a cross-section perpendicular to a stripe direction of the ridge. Thus, it is preferable to continue the wet etching until the ridge lateral surfaces in the region without the SiO$_2$ lateral wall protective layer 116 (second ridge lateral wall surfaces 119: a skirt portion of the ridge) become substantially linear. Although a part of the wet etching process carried out until the second ridge lateral wall surfaces 119 (the second surfaces) achieve substantially linear inclined surfaces in the cross-section is referred to as an "additional etching" for easy understanding, the above-described wet etching does not have to be carried out at two stages but only has to be carried out until the second ridge lateral wall surfaces 119 achieve substantially linear inclined surfaces in their cross-section. Incidentally, the amount of this additional etching may be selected suitably according to the kind and mixture ratio of the chemical solutions.

Subsequently, as shown in FIG. 2A(g), the SiO$_2$ lateral wall protective layers 116 are removed using a hydrofluoric acid-based chemical solution.

In Embodiment 1, since the SiO$_2$ stripe 114 is set to be thicker than the SiO$_2$ lateral wall protective layers 116 by 100 to 300 nm, the SiO$_2$ lateral wall protective layers 116 can be removed alone by stopping the etching using the hydrofluoric acid-based chemical solution by time control.

Although Embodiment 1 uses the wet etching technique for removing the SiO$_2$ lateral wall protective layers 116, there is no particular limitation to the wet etching. According to the material of the lateral wall protective layers, chemical dry etching (in the following, referred to as CDE) or the like should be selected suitably. Here, it is appropriate to employ an etching technique capable of removing the SiO$_2$ lateral wall protective layers 116 selectively according to the material of the lateral wall protective layers.

Next, as shown in FIG. 2A(h), using the SiO$_2$ stripe 114 as a mask, an n-type Al$_{0.5}$In$_{0.5}$P current blocking layer 107 is grown selectively to achieve a thickness of 0.2 to 0.4 μm by MOCVD. Subsequently, using the SiO$_2$ stripe 114 as a mask, an n-type GaAs cap layer 111 is grown selectively to achieve a thickness of 0.1 to 0.2 μm by MOCVD.

It should be noted that, before growing the n-type $Al_{0.5}In_{0.5}P$ current blocking layer 107, a surface treatment with a sulfuric acid chemical solution is carried out for removing a damaged layer of the ridge lateral walls. At this time, the ridge lateral walls are etched in the range of about 15 nm to 40 nm. Also, the chemical solution for the surface treatment may be a mixture solution of hydrochloric acid and water.

Incidentally, as to the current blocking layer, there is an expression "a current blocking layer formed in a region except for at least a part on the ridge" in the above description. This means that either the current blocking layer is not formed on an upper surface of the ridge or, though not shown in the figure, the current blocking layer may cover the vicinities of both end portions in a longitudinal direction on the upper surface of the ridge extending like a stripe. The latter case is rather preferable.

Next, as shown in FIG. 2A(i), after removing the $SiO_2$ stripe 114 with a hydrofluoric acid-based chemical solution or the like, a p-side electrode 112 and an n-side electrode 101 are formed by vacuum evaporation, thus completing a ridge stripe semiconductor laser wafer. The material of the p-side electrode 112 can be Ti/Pt/Au, for example, and the material of the n-side electrode 101 can be AuGe/Ni/Au, for example.

Incidentally, although Embodiment 1 uses the n-type $Al_{0.5}In_{0.5}P$ current blocking layer 107, it also may use a dielectric film of SiN, $SiO_2$ or the like. In this case, the n-type GaAs cap layer 111 does not need to be grown.

The ridge-shaped stripe formed in Embodiment 1 has high perpendicularity and high symmetry, and an angle that the ridge lateral surfaces closer to an upper end of the ridge formed by the dry etching (the first ridge lateral wall surfaces 118) form with the surface of the n-type GaAs substrate 102 can be set to range from 85° to 95°. Incidentally, reference numerals of the first surface (first ridge lateral wall surface) 118 and the second surface (second ridge lateral wall surface) 119 are provided only in FIGS. 2A(g) and 2B(j) to (n), and they are omitted in the other figures for easy viewing. Here, the angle that the ridge lateral surface forms with the surface of the semiconductor substrate is an angle on a side indicated by numeral 120 in FIG. 2A (g), (h) and (i) (in other words, an angle that the ridge lateral surface forms with the surface of the semiconductor substrate on an inner side of the ridge). This definition also applies to the angle that the first surface 118 and the second surface 119 form with the surface of the semiconductor substrate or the angle that a third intermediate surface forms with the surface of the semiconductor substrate in the case where the third intermediate surface is present between the first surface and the second surface. Although numeral 120 is omitted in the other figures, the similar definition applies to the angle that the ridge lateral surfaces form with the surface of the semiconductor substrate. Also, as described earlier, the angle that the first surfaces (first ridge lateral wall surfaces) 118 form with the surface of the semiconductor substrate 102 substantially is a right angle, more preferably, ranges from 85° to 95°. In other words, the cross-section of the ridge has a regular mesa shape in the case of an angle smaller than 90° in the above-noted range, and it has more or less an inverted mesa shape in the case of an angle larger than 90° in the above-noted range. When the angle that the first ridge lateral wall surfaces 118 form with the surface of the semiconductor substrate 102 substantially is a right angle, it preferably is an angle in the range including both these cases.

On the other hand, an angle that the ridge inclined surfaces closer to a lower end of the ridge formed by the wet etching (the second ridge lateral wall surfaces 119) form with the surface of the n-type GaAs substrate 102 ranges from 40° to 65°. In the case of using the off-angled semiconductor substrate, the angle that the ridge inclined surfaces closer to the lower end of the ridge (the second surfaces) form with the surface of the n-type GaAs substrate 102 differs between the ridge lateral walls on both sides. For example, when the off-angle is about 10°, the above-noted angle is 40° to 50° on one side and 60° to 70° on the other side. This angle is attributable to the fact that a (111) plane of $(Al_{0.7}Ga_{0.3})_{0.5}In_{0.5}P$ of the p-type second cladding layer 108 mainly is exposed in the skirt portion of the ridge. The reason will be given below.

First, since the p-type second cladding layer 108 is grown epitaxially on the n-type GaAs substrate 102, a crystal orientation of the p-type $(Al_{0.7}Ga_{0.3})_{0.5}In_{0.5}P$ second cladding layer 108 and that of the n-type GaAs substrate 102 are aligned substantially. When a (100) plane of the GaAs substrate is not tilted, an angle between the (100) plane and the (111) plane is about 50°. Further, the etching speed in the (111) plane having the largest number of atomic arrangements in a crystal structure of GaAs and an Si single crystal (a zincblende structure) is slowest, and it becomes dominant as the wet etching proceeds in the skirt portion of the ridge. Since the (100) plane is tilted by about 10° in a [011] direction in Embodiment 1, the (111) plane exposed on one side of the ridge is tilted at about 40° and the (111) plane exposed on the other side thereof is tilted at about 60°. As described above, the second ridge lateral wall surfaces 119 formed by the wet etching mainly are the (111) plane in Embodiment 1.

Although the first surfaces, which are main surfaces of the ridge lateral wall surfaces as described above, are substantially perpendicular to the surface of the semiconductor substrate, an angle that the second surfaces in the skirt portion contacting the substrate surface form with the substrate surface is small, forming a gentle slope. Accordingly, even when using the dielectric film of SiN, $SiO_2$ or the like as the current blocking layer, no undersupply of a material gas for forming the current blocking layer formed of the dielectric film of SiN, $SiO_2$ or the like in the skirt portion of the ridge occurs near the skirt portion of the ridge, so that the coverage of the current blocking layer in the skirt portion of the ridge, which is close to an emission position and most influential on the emission light, improves. Also, with the additional wet etching, the ridge inclined surfaces closer to the lower end of the ridge (the second ridge lateral wall surfaces 119) become substantially linear inclined surfaces in their cross-section perpendicular to the stripe direction of the ridge, so that the number of exposed crystal faces decreases compared with the case of the curved surfaces. Consequently, the crystallinity of the epitaxially-grown n-type $Al_{0.5}In_{0.5}P$ current blocking layer 107 in the skirt portion of the ridge improves.

Figure 4:
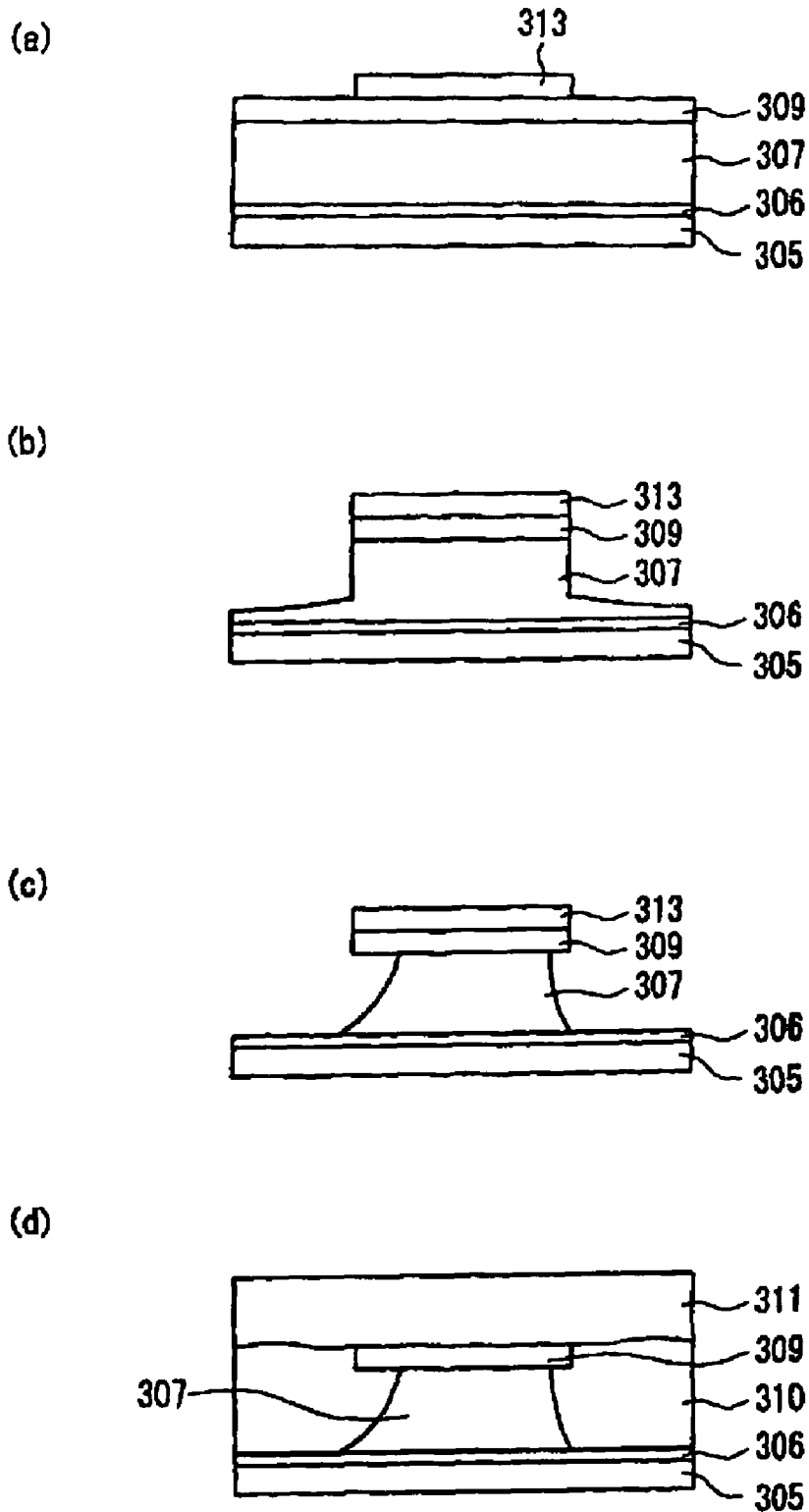
FIG. 4 is a sectional view showing manufacturing processes of the conventional ridge stripe semiconductor laser device shown in FIG. 3.
Figure 5:
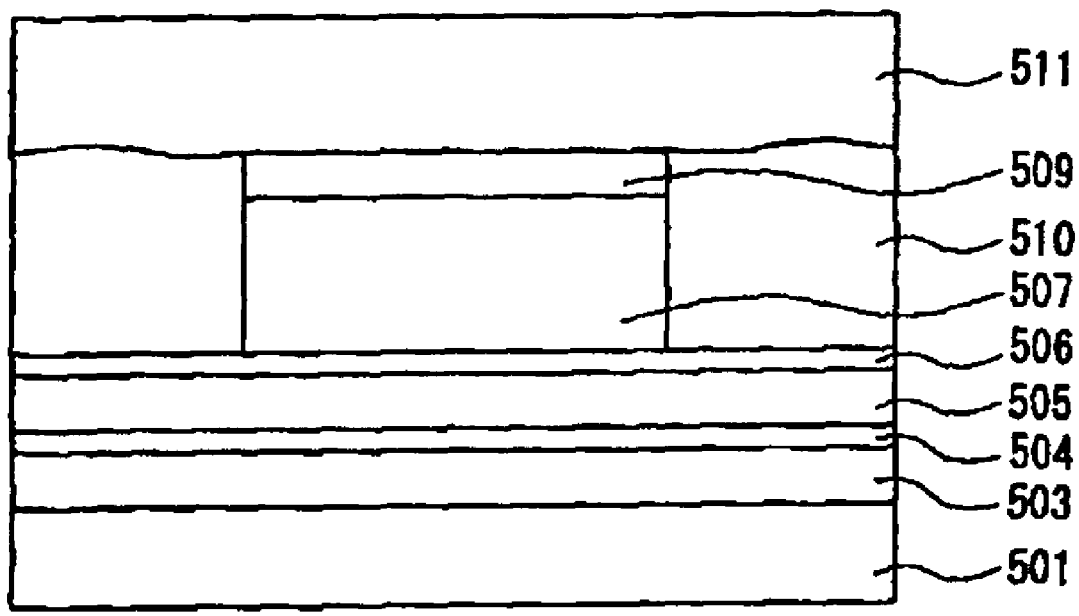
FIG. 5 is a sectional view showing a structure of an embodiment of a conventional ridge stripe semiconductor laser device.
Figure 6:
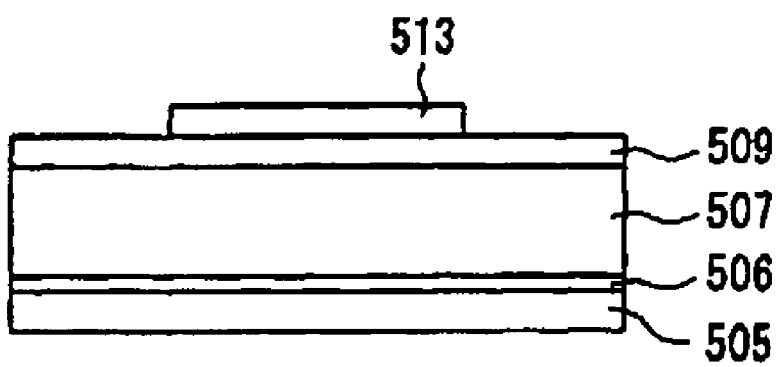
FIG. 6 is a sectional view showing manufacturing processes of the conventional ridge stripe semiconductor laser device shown in FIG. 5.
Figure 6:
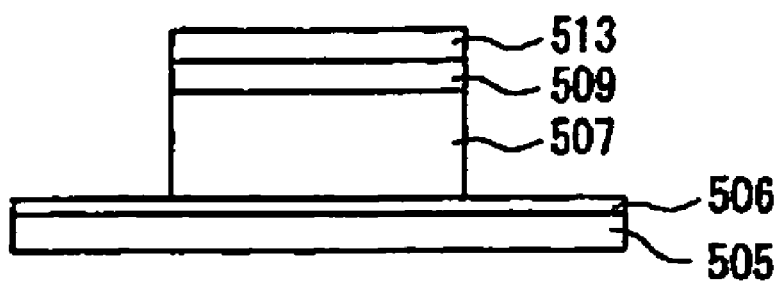
Figure 6:
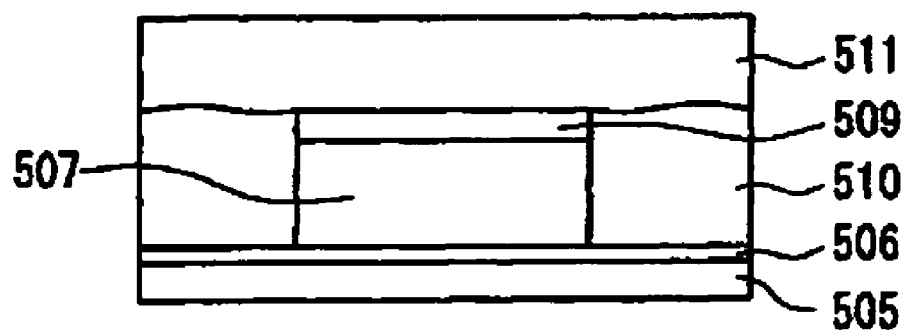
Figure 7:
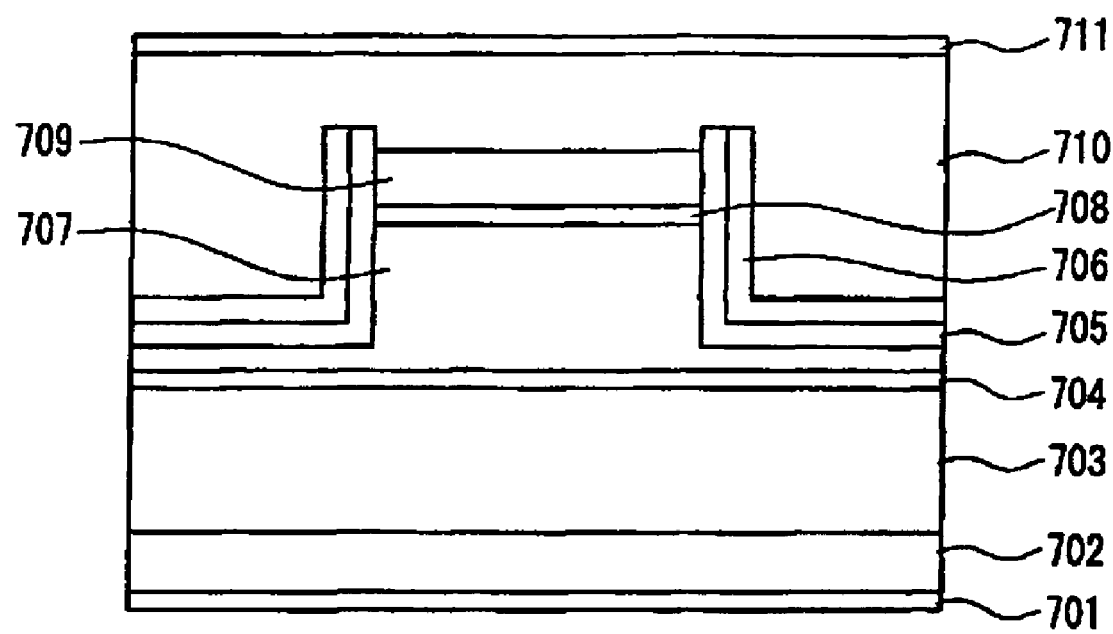
FIG. 7 is a sectional view showing a structure of an embodiment of a conventional ridge stripe semiconductor laser device.
Figure 8:
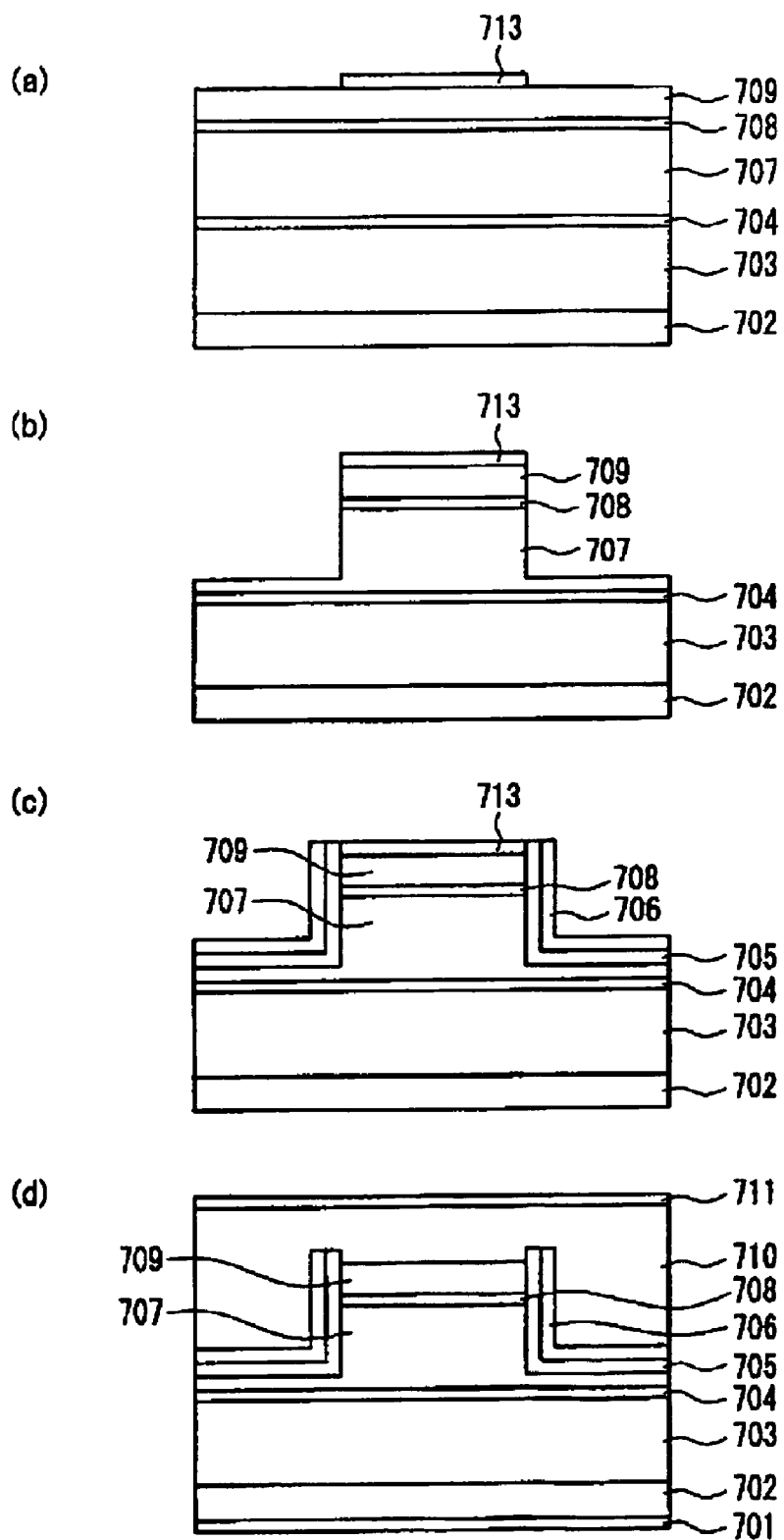
FIG. 8 is a sectional view showing manufacturing processes of the conventional ridge stripe semiconductor laser device shown in FIG. 7.

Moreover, in the ridge top portion formed in Embodiment 1, the p-type $Ga_{0.5}In_{0.5}P$ intermediate layer 109 and the p-type GaAs contact layer 110 do not protrude to form eaves-like overhangs. Thus, at the time of growing the n-type $Al_{0.5}In_{0.5}P$ current blocking layer 107, cavities are not formed. In the conventional method for forming the ridge using the wet etching technique, the overhangs are formed in the ridge top portion (see FIG. 4(c), for example), and cavities are formed immediately under the overhangs at the time of forming the n-type $Al_{0.5}In_{0.5}P$ current blocking layer 107, which affects the element characteristics adversely.

Also, in Embodiment 1, a border between the ridge lateral wall surface formed by the dry etching and the ridge lateral wall surface formed by the wet etching, namely, a border portion between the first ridge lateral wall surface 118 and the second ridge lateral wall surface 119 is angled, in other words, serves as a bent portion, and the first ridge lateral wall surface and the second ridge lateral wall surface are formed in such a manner as to be connected. However, owing to the amount of side etching caused under the $SiO_2$ lateral wall protective layers 116 at the time of wet-etching the p-type $(Al_{0.7}Ga_{0.3})_{0.5}In_{0.5}P$ second cladding layer 108 and the variation in the thickness of the $SiO_2$ lateral wall protective layers 116, steps (step surfaces) having surfaces substantially parallel with the surface of the semiconductor substrate protruding toward an outside of the ridge or denting toward an inside of the ridge as indicated by numeral 117 in FIG. 2B(j) and FIG. 2B(k) (both are figures showing processes corresponding to the process (g) in FIG. 2A), for example, sometimes are formed between the ridge inclined surfaces closer to the lower end of the ridge (the second ridge lateral wall surfaces 119) and the ridge lateral wall surfaces above them (the first ridge lateral wall surfaces 118) (such as the step surfaces of the above-mentioned (b1) of the third intermediate surfaces). Further, in the case of using the off-angled semiconductor substrate, the amount of side etching (the amount to be side-etched) in the cross-section perpendicular to the stripe direction of the ridge differs between both sides of the ridge. At this time, with an increase in the off-angle of the substrate, the difference in the side etching amount between the both sides of the ridge enlarges. Accordingly, in this case, the step surfaces 117 as shown in FIG. 2B(l), (m) or (n) (all are figures showing processes corresponding to the process (g) in FIG. 2A) are formed.

Figure 2B:
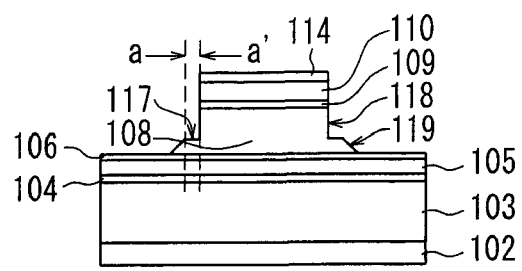
FIG. 2B partially shows a cross-section perpendicular to a stripe direction of a ridge in a process of another embodiment in various embodiments of the present invention corresponding to the process (g) in FIG. 2A.
Figure 2B:
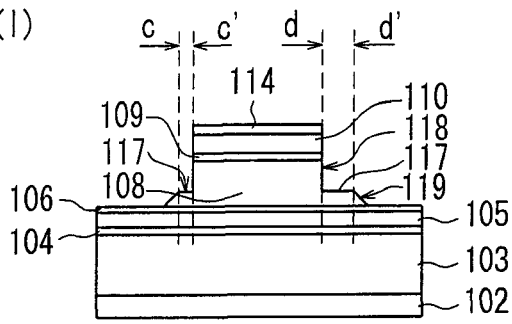
Figure 2B:
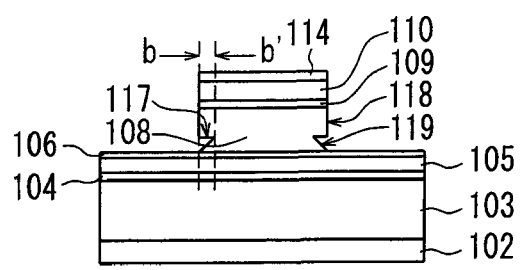
Figure 2B:
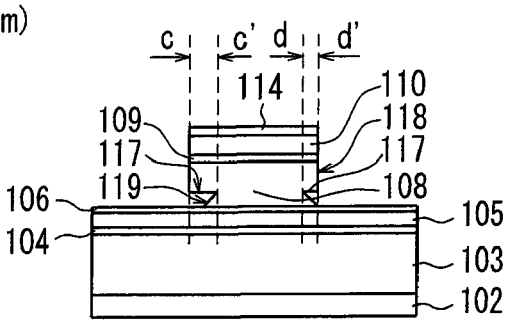
Figure 2B:
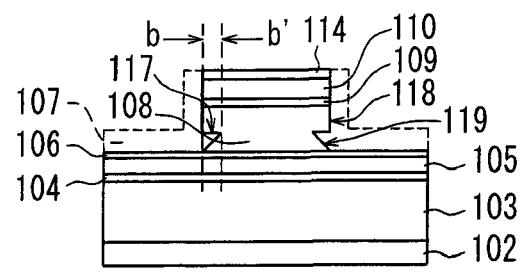
Figure 2B:
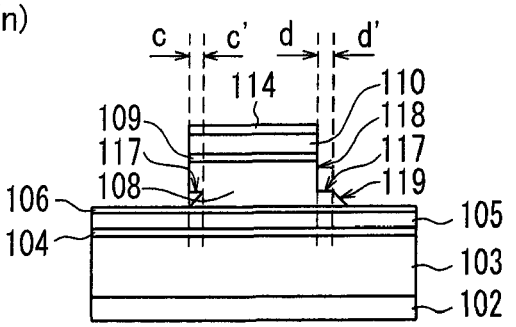

Here, as shown in FIG. 2B(j) and FIG. 2B(k), smaller dimensions a-a' and b-b' of the step surfaces 117 are more preferable, and it is desired that these dimensions a-a' and b-b' be not greater than 0.2 µm and, more preferably, not greater than 0.1 µm. Incidentally, in the case of using the off-angled semiconductor substrate, as shown in FIGS. 2B(l), (m) and (n), dimensions c-c' and d-d' of left and right step surfaces 117 are different. In both of the step surfaces 117, smaller dimensions of them are more preferable, and it is desired that these dimensions c-c' and d-d' be not greater than 0.2 µm and, more preferably, not greater than 0.1 µm.

In the structure illustrated in Embodiment 1, for example, when a designed ridge width in a direction perpendicular to the stripe direction (here, upper and lower surfaces of the ridge are assumed to have the same width) is set to 1.5 µm and a maximum portion of an intensity of a distribution of a laser beam guided in a resonator (Near Field Pattern; in the following, abbreviated as NFP) is set to 100%, the intensity of NFP is about 50% about 0.2 µm outside from the designed lower end of the ridge. Therefore, as long as the step surfaces have a length within this range (not greater than 0.2 µm), an abrupt change in a refractive index owing to the step portion does not influence the laser beam very much. Here, the "change in a refractive index" is a difference in refractive index between the p-type second cladding layer 108 and the n-type current blocking layer 107. Also, the substantially linear step surfaces that are substantially parallel with the surface of the semiconductor substrate in the cross-section can be illustrated more specifically as the surfaces of the steps 117 shown in FIG. 2B(j), (k), (l), (m) and (n), for example. In the following, such step surfaces sometimes are referred to simply as steps or step portions.

The steps 117 shown in FIG. 2B(j) are steps protruding toward the outside of the ridge lateral surfaces (with right and left steps having the same length) and generated in the case where the side etching amount (the amount to be side-etched) is smaller than the thickness of the lateral wall protective layers in the wet etching processes (e) to (f) in FIG. 2A when the semiconductor substrate that is not off-angled is used, for example. On the other hand, the steps 117 shown in FIG. 2B(k) denting toward the inside of the ridge (with right and left steps having the same length) are generated in the case where the side etching amount (the amount to be side-etched) is larger than the thickness of the lateral wall protective layers in the above-mentioned wet etching processes when the semiconductor substrate that is not off-angled is used.

In the case where the semiconductor substrate that is off-angled is used, the ridge shape varies as described below according to the thickness of the lateral wall protective layers and the amount of side etching generated on both sides of the ridge in the above-described wet etching processes. The ridge shape shown in FIG. 2B(l) is formed in the case where the larger amount of side etching (the larger amount to be side-etched) out of the amounts of side etching generated on both sides of the ridge in the wet etching processes is smaller than the thickness of the lateral wall protective layer. On the other hand, the ridge shape shown in FIG. 2B(m) is formed in the case where the amounts of the side etching generated on both sides of the ridge in the wet etching processes are larger than the thicknesses of the respective lateral wall protective layers. Further, the ridge shape shown in FIG. 2B(n) is formed in the case where one amount of side etching (amount to be side-etched) out of the amounts of side etching generated on both sides of the ridge in the wet etching processes is larger than the thickness of the lateral wall protective layer and the other amount of side etching (amount to be side-etched) is smaller than the thickness of the lateral wall protective layer.

It should be noted that each of FIG. 2B(j), (k), (l), (m) and (n) is a sectional view taken in the direction perpendicular to the stripe direction of the ridge similar to FIG. 2A(g) in another mode in the process corresponding to the process (g) in FIG. 2A.

In the case where there is a surface that protrudes toward the outside of the ridge or dents toward the inside of the ridge and is substantially parallel with the surface of the semiconductor substrate, in other words, the step 117 protruding toward the outside of the ridge lateral surface or the step 117 denting toward the inside of the ridge, such a state is expressed in the present invention as the first ridge lateral wall surface 118 and the second ridge lateral wall surface 119 being connected via the step, which is one of the third intermediate surfaces.

Here, by the experiment conducted by the inventors of the present invention, it was found in Embodiment 1 that the amount of side etching (the amount to be side-etched) at the time of wet etching on a straight line substantially parallel with the surface of the semiconductor substrate (a straight line z in FIG. 2A(j) was constant at a position where the first ridge lateral wall surface 118 and the second ridge lateral wall surface 119 are connected when viewed such that the surface of the semiconductor substrate faces downward in the cross-section perpendicular to the stripe direction of the ridge. As described above, this is because the second ridge lateral wall surface 119 becomes aligned with a (111) plane at the time of wet etching, so that the etching speed becomes constant and stabilized. Accordingly, by setting (side etching amount)≦(thickness of lateral wall protective layer), the shape of the ridge lateral wall surface 119, which is the second surface, protruding toward the outside of the ridge, can be formed stably in a wafer surface. On the other hand, by setting (side etching amount)>(thickness of lateral wall protective layer) so that the ridge lateral wall surface 119, which is the second surface, dents toward the inside of the ridge, the ridge as shown in FIG. 2B(k), for example, is formed. Here, when the wet etching is carried out longer, with an increase in the etching time, the position at which a lowermost end of the second ridge lateral wall surface 119 contacts the etching stop layer 106 does not change, but the surface 119 in FIG. 2B(k) is extended obliquely upward along this surface, and the step 117 moves toward an upper end of the ridge by the etching, so that the dimension of the step 117 increases as shown in FIG. 2B(k'). In other words, in the case where the ridge lateral wall surface is set to dent toward the inside of the ridge, the variations of the wet etching speed lower the controllability and stability of the ridge dimension. In particular, constriction is formed in the ridge, whereby the electric current path is narrowed, thus increasing the resistance at the time of operating the laser. Thus, the deterioration of characteristics such as an increase in a threshold becomes likely to occur. Also, in the case where there is this constriction as shown in FIG. 2B(k'), the current blocking layer does not fill fully in a portion of this constriction when forming the current blocking layer, so that cavities may be formed. Thus, it is desired that (side etching amount)≦(thickness of lateral wall protective layer) on both sides of the ridge. For this setting, since the wet etching stops earlier as the distance between the lower end of the lateral wall protective layer 116 and the etching stop layer 106 is smaller, it is appropriate to adjust the distance between the lower end of the lateral wall protective layer 116 and the etching stop layer 106 according to the thickness of the lateral wall protective layer 116 or to adjust the thickness of the lateral wall protective layer 116 according to the distance between the lower end of the lateral wall protective layer 116 and the etching stop layer 106, for example.

Further, in the case of using the dielectric film of SiN, $SiO_2$ or the like as the current blocking layer, it is desired that the dimensions a-a', b-b', c-c' and d-d' of the steps 117 be not greater than the thickness of the current blocking layer in the ridge lateral wall surface. Although the angle that the first ridge lateral wall surfaces 118 form with the surface substantially parallel with the surface of the semiconductor substrate is approximately 90°, no undersupply of the material gas for forming the dielectric film of SiN, $SiO_2$ or the like in the step portion occurs because the current blocking layer is sufficiently thicker than the dimension of the step 117, so that the coverage of the current blocking layer does not drop, which is preferable.

As described above, according to Embodiment 1, after forming the stripe-shaped ridge by dry etching so that a part of the p-type second cladding layer remains, the lateral walls of the ridge are protected with $SiO_2$ or the like, followed by removing the p-type second cladding layer by wet etching. Consequently, the stripe-shaped ridge having high perpendicularity and high symmetry can be formed, thus reducing the difference between a carrier distribution profile and an optical distribution profile of the resultant semiconductor laser device, suppressing a hole burning phenomenon and improving a kink level. Also, the ridge height can be increased, thereby preventing a laser beam from being absorbed in the GaAs cap layer, etc., making it possible to achieve a high power semiconductor laser with light dispersed widely from the active layer. Furthermore, the angle that the ridge portion forms with its lower layer is reduced, thereby preventing cracks. Moreover, by setting (side etching amount)≦(thickness of lateral wall protective layer) at the time of the wet etching, the shape of the ridge lateral wall surface 119, which is the second surface, protruding toward the outside of the ridge can be formed stably on a wafer surface. This prevents the formation of the constriction in the ridge, which increases the resistance at the time of operating the laser, and also prevents the formation of the cavities in the skirt portion of the ridge, which varies the refractive index considerably.

Embodiment 2

Figure 2C:
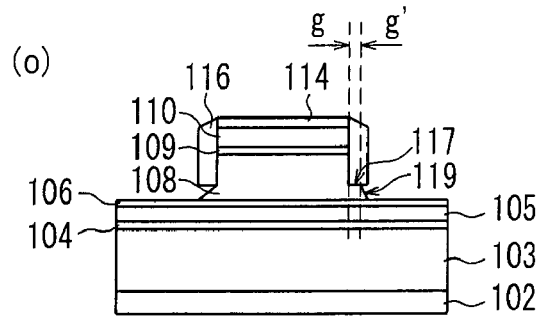
FIG. 2C is a sectional view showing a process in another embodiment of the present invention corresponding to the processes (f) to (i) in FIG. 2A.
Figure 2C:
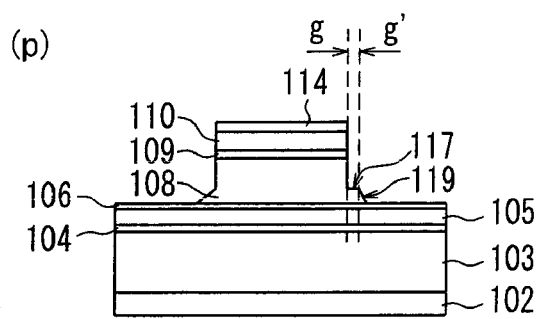
Figure 2C:
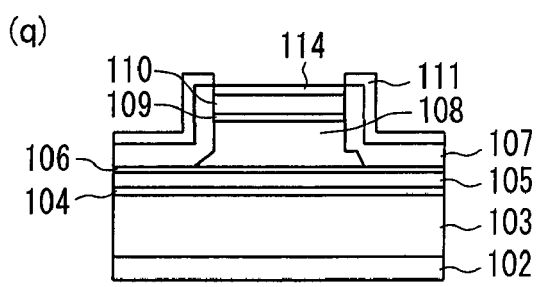
Figure 2C:
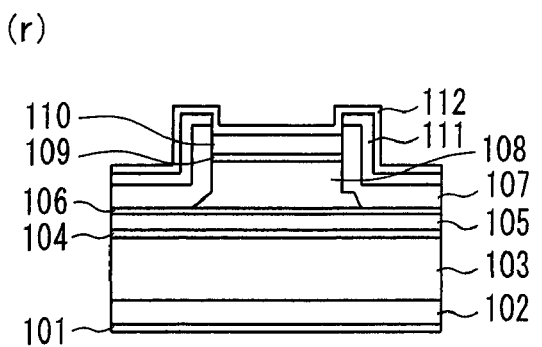
Figure 2D:
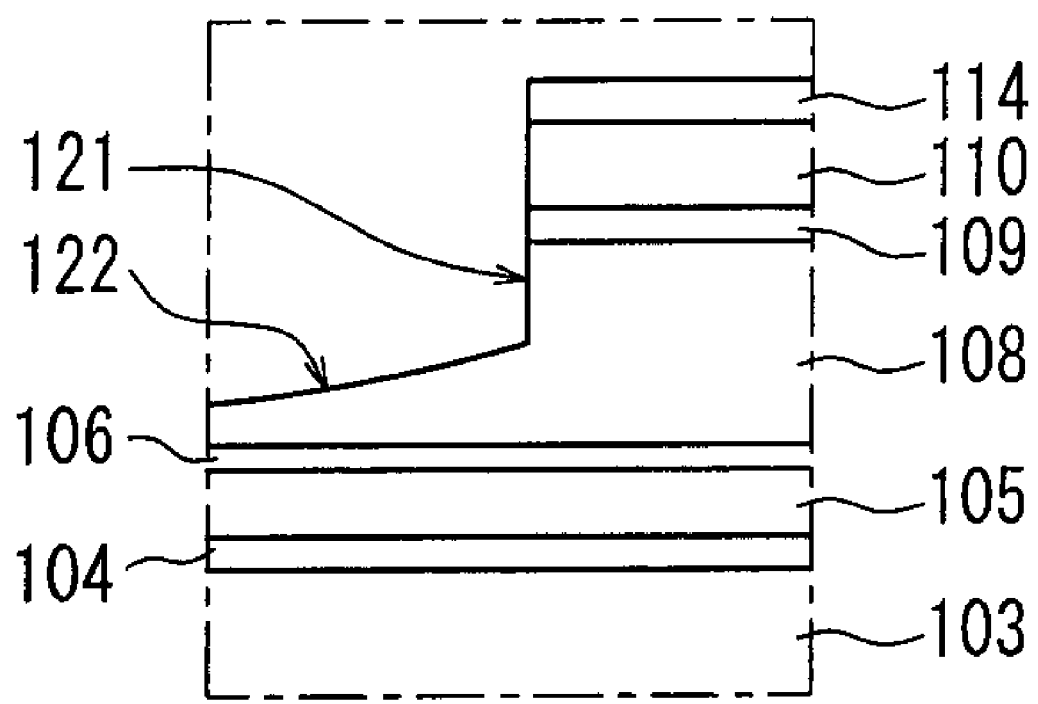
FIG. 2D is a partially enlarged view showing the ridge and a region near a skirt portion thereof in the process (c) in FIG. 2A.
Figure 2E:
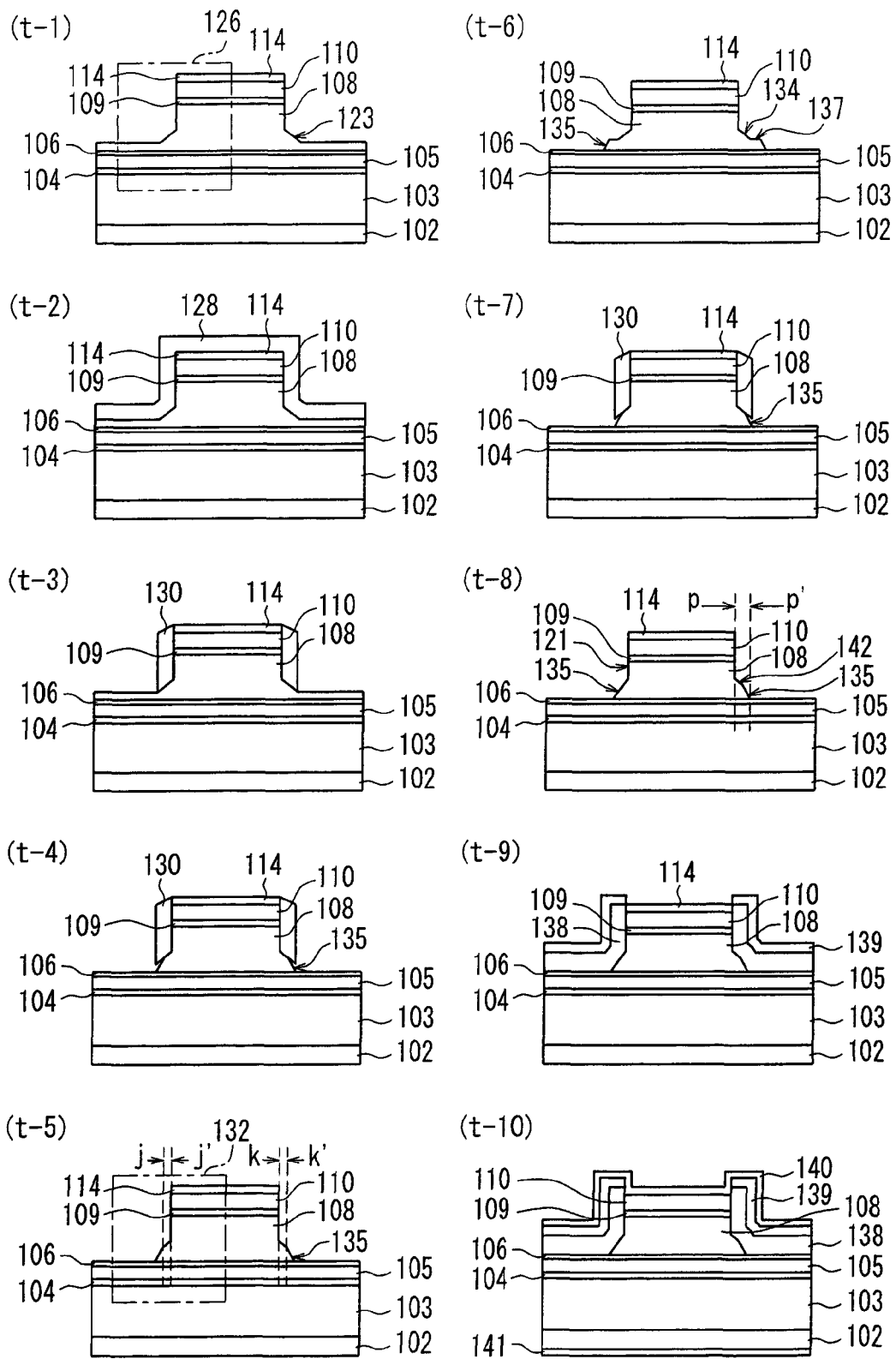
FIG. 2E is a sectional view showing a process in another embodiment of the present invention corresponding to the process (c) and thereafter in FIG. 2A.
Figure 2F:
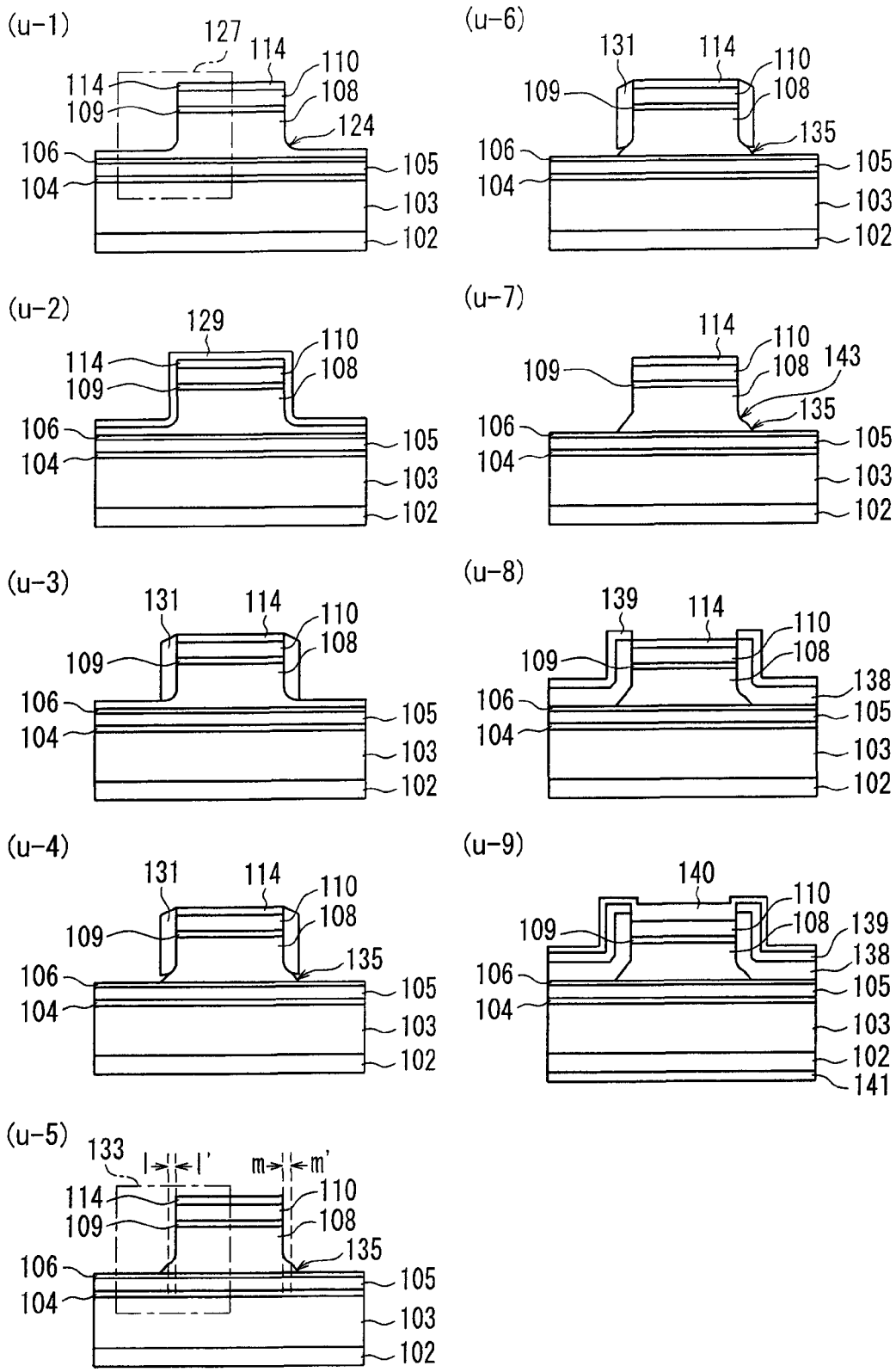
FIG. 2F is a sectional view showing a process in another embodiment of the present invention corresponding to the process (c) and thereafter in FIG. 2A.

FIGS. 2E and 2F are sectional views showing manufacturing processes of a ridge stripe semiconductor laser device in Embodiment 2. Embodiment 2 aims at suppressing the changes in a refractive index due to the steps 117 described above and forming the dimension and shape of the ridge stably. Since Embodiment 2 has the processes up to forming the $SiO_2$ stripe 114 as shown in FIG. 2A(b) in common with Embodiment 1, only the processes thereafter will be described here. Also, the present embodiment has the configuration of the layers in common with Embodiment 1.

After forming the $SiO_2$ stripe 114, the p-type ($Al_{0.7}Ga_{0.3}$)$_{0.5}In_{0.5}$P second cladding layer 108, the p-type $Ga_{0.5}In_{0.5}$P intermediate layer 109 and the p-type GaAs contact layer 110 are dry-etched midway through the p-type ($Al_{0.7}Ga_{0.3}$)$_{0.5}In_{0.5}$P second cladding layer 108 using the $SiO_2$ stripe 114 as a mask in order to suppress the formation of a refractive index step caused by the step 117. At this time, the ridge shape generally is formed of the first post-dry etching lateral wall surface 121 and the post-dry etching bottom surface 122 as shown in FIG. 2D of Embodiment 1. Here, FIG. 2D is an enlarged view showing the vicinity 125 of the ridge and a skirt region thereof in FIG. 2A(c). In the case where, using such a dry-etched shape, the lateral wall protective layer 116 is formed and wet-etched as shown in FIG. 2A(d) and (e), the ridge whose lateral wall surfaces protrude toward the outside of the ridge is formed by setting (side etching amount)≦(thickness of lateral wall protective layer) on both sides of the ridge viewed when the surface of the semiconductor substrate faces downward, so that the side etching is caused under the $SiO_2$ lateral wall protective layers 116. Thus, regions of the post-dry etching bottom surfaces 122 under the $SiO_2$ lateral wall protective layers 116 become the steps 117 substantially parallel with the surface of the semiconductor substrate (the step surfaces of (b1) of the third intermediate surfaces) (see the steps 117 in FIG. 2B(j)).

Also, as described earlier, smaller dimensions (dimensions in a transverse direction in the figure) of these steps 117 are more preferable, and it is desired that these dimensions be not greater than 0.2 μm and, more preferably, not greater than 0.1 μm. When the steps 117 have a dimension equal to or greater than 0.2 μm, the refractive index varies steeply in a region with a low intensity (an intensity of equal to or lower than 50%) of a laser beam guided in a resonator, so that NFP becomes likely to be disturbed. When the NFP is disturbed, the distribution profile of light emitted from a laser element (Far Field Pattern; in the following, referred to as FFP) also deforms. For example, when the laser beam is focused on an optical disk through an objective lens, etc., a perfectly-circular shape is not achieved, which may cause anomalies in reading data from or writing data onto the disk. Now, by setting (the side etching amount)=(the thickness of the $SiO_2$ lateral wall protective layer 116), it indeed is possible to form the ridge whose steps 117 have a dimension of 0 μm, namely, the ridge without steps 117 (see FIG. 2A(f) and (g)). However, due to the variations in the wet etching speed and the thickness of the $SiO_2$ lateral wall protective layer 116, a considerably strict control is required in order to suppress the formation of the steps 117 completely over the entire wafer. Also, in the case where the off-angled semiconductor substrate is used, the steps 117 on both sides of the ridge have different dimensions viewed when the surface of the semiconductor substrate faces downward. Therefore, even if the dimension of the step 117 on one side is set to 0 μm, the formation of the step 117 is inevitable on the other side (see FIG. 2C(o) and (p)).

Accordingly, in Embodiment 2, at the time of dry-etching the p-type $(Al_{0.7}Ga_{0.3})_{0.5}In_{0.5}P$ second cladding layer 108, the p-type $Ga_{0.5}In_{0.5}P$ intermediate layer 109 and the p-type GaAs contact layer 110 midway through the p-type $(Al_{0.7}Ga_{0.3})_{0.5}In_{0.5}P$ second cladding layer 108 using the $SiO_2$ stripe 114 as a mask, the following dry etching condition is selected to perform the dry etching so that the ridge shape as shown in FIGS. 2E(t-1) and 2F(u-1), for example, is achieved. Incidentally, FIGS. 2G and 2H are enlarged views respectively showing a portion 126 in FIG. 2E(t-1) and a portion 127 in FIG. 2F(u-1) (the ridge and a portion near the skirt portion thereof).

In Embodiment 2, the ICP method is adopted as the above-noted dry etching technique, and a mixed gas of $SiCl_4$ and Ar is used as the etching gas. As the etching condition achieving the shape of the skirt portion of the ridge as shown in FIG. 2E(t-1), the content of $SiCl_4$ in the mixed gas is 5% to 12% by volume, the temperature of a lower electrode provided with the semiconductor substrate is 150° C. to 200° C., the pressure inside a chamber is 0.3 to 0.5 Pa, the bias power of the lower electrode is 50 to 150 W, and the ICP power is 200 to 300 W. However, there is no particular limitation to them, and the dry etching condition that can achieve a desired shape may be selected suitably. As the etching condition achieving FIG. 2F(u-1), the content of $SiCl_4$ in the mixed gas is 5% to 12% by volume, the temperature of the lower electrode provided with the semiconductor substrate is 150° C. to 200° C., the pressure inside a chamber is 0.1 to 0.3 Pa, the bias power of the lower electrode is 50 to 150 W, and the ICP power is 200 to 300 W. However, there is no particular limitation to them, and the dry etching condition that can achieve a desired shape may be selected suitably.

Figure 2G:
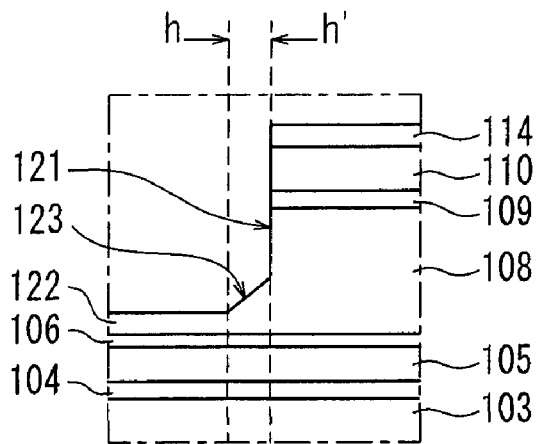
FIG. 2G is a partially enlarged view showing the ridge and the region near the skirt portion thereof in the process (t-1) in FIG. 2E.
Figure 2H:
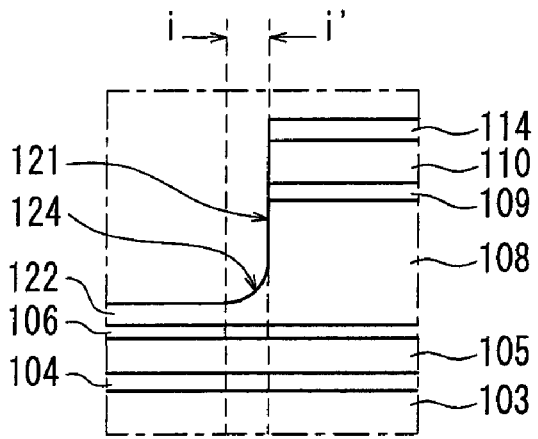
FIG. 2H is a partially enlarged view showing the ridge and the region near the skirt portion thereof in the process (u-1) in FIG. 2F.

FIG. 2G is the enlarged view showing the portion 126 of the ridge and the region near the skirt portion thereof in FIG. 2E(t-1). A post-dry etching lateral wall surface 123 serving as a third inclined intermediate surface is formed between the first post-dry etching lateral wall surface 121 substantially perpendicular to the surface of the semiconductor substrate and the post-dry etching bottom surface 122. It should be noted that the post-dry etching lateral wall surface 123 serving as the third inclined intermediate surface may be formed of plural surfaces or of a shape obtained by joining plural narrow surfaces, namely, a curved surface (shown as a curved line in the sectional view) as a post-dry etching lateral wall surface 124 serving as the third inclined intermediate surface in FIG. 2H, which is the enlarged view showing the portion 127 of the ridge and the region near the skirt portion thereof in FIG. 2F(u-1). In the case where there are a plurality of these post-dry etching lateral wall surfaces serving as the third inclined intermediate surface, the angle that the ridge lateral wall surface serving as this third inclined intermediate surface forms with the surface of the semiconductor substrate decreases toward the p-type $Ga_{0.5}In_{0.5}P$ etching stop layer 106. In the case of the curved surface, the angle that the ridge lateral wall surface forms with the surface of the semiconductor substrate probably may be an angle that a tangent line at each position on the curved line in the above-mentioned sectional view forms with the surface of the semiconductor substrate, and this angle decreases toward the etching stop layer 106. In other words, this curved line is a curved line that is convex toward the inside of the ridge.

Here, the amount of the dry etching ranges from 65% to 95%, preferably from 80% to 95%, of the ridge height. Within this range, it is possible to suppress variation of the amount of side etching caused by wet etching in the skirt portion of the ridge. This is because, in the case where a region of the first surface formed by the dry etching is too small and thus a region to be wet-etched is too large, the etching amount of the wet etching varies considerably depending on the state (concentration, temperature, etc.) of an etchant, so that the influence of a crystal face of the second surface becomes less dominant. Herein, the above-described numerical range of the amount of dry etching and the ridge height indicates the relationship between the dry etching amount and the ridge height in the ridge lateral surface portion. In other words, in Embodiment 2, as shown in FIGS. 2G and 2H, the angle that the ridge lateral wall surface forms with the surface of the semiconductor substrate decreases toward the p-type $Ga_{0.5}In_{0.5}P$ etching stop layer 106.

Accordingly, in the case of setting the amount of the dry etching for forming the surface substantially perpendicular to the surface of the semiconductor substrate to be in the range of 65% to 95% of the ridge height, a height in the first post-dry etching lateral wall surface 121 serves as a reference ridge height. In other words, in the case of setting the dry etching amount to be in the range of 65% to 95% of the ridge height, a distance of a normal line from the upper end of the ridge to the surface of the etching stop layer 106 serves as a reference ridge height.

Then, the dry etching is performed so that its amount is in the range of 65% to 95% of the ridge height. It should be noted that the above-described numerical range of the amount of dry etching and the ridge height and the ridge height serving as the reference are similar to those in Embodiment 1.

In Embodiment 2, as shown in FIGS. 2G and 2H, the angle that the ridge lateral wall surface forms with the surface of the semiconductor substrate decreases toward the p-type $Ga_{0.5}In_{0.5}P$ etching stop layer 106.

Also, the method for obtaining such a desired dry etching amount can be a method in which the etching is stopped by time control or a method in which monochromatic light is illuminated on a substrate surface, the etching is carried out while calculating a remaining thickness to be etched from the relationship between an interference intensity obtained by the reflected light and a time, and the etching is stopped when a desired thickness is reached.

In the present invention, as the dry etching technique that can be adopted preferably in the case of forming the first surface and the third inclined intermediate surface by dry etching, not only the ICP method described above but also any other technique can be adopted as long as it is an anisotropic plasma etching. Examples of the dry etching include a method using electron cyclotron resonance (in the following, referred to as ECR) plasma, and the like. Also, an etching gas can be a mixed gas of $SiCl_4$ and Ar. The $SiCl_4$ gas component may be replaced by chlorine gas or boron trichloride gas.

Subsequently, as shown in FIGS. 2E(t-2) and 2F(u-2), $SiO_2$ films 128 and 129 with a thickness of 60 nm to 400 nm are grown on an entire surface (including ridge lateral surfaces) of an intermediate obtained in FIGS. 2E(t-1) and 2F(u-1) by plasma CVD.

Although the $SiO_2$ films 128 and 129 with a thickness of 60 nm to 400 nm are grown for the purpose of forming ridge lateral wall protective layers in Embodiment 2, the thicknesses of the $SiO_2$ films 128 and 129 are not limited to them. In order to remove the $SiO_2$ films 128 and 129 in a region other than the ridge lateral wall surfaces in the subsequent process, the thicknesses of the $SiO_2$ films 128 and 129 may be selected suitably according to the amount of side etching caused by an additional dry etching or the amount of etching at the time of wet etching using a hydrofluoric acid-based chemical solution carried out suitably for a surface treatment in each process, without any particular limitation.

Further, the $SiO_2$ films 128 and 129 used in Embodiment 2 are not limited to them. As a material that can be used for the lateral wall protective layer, it is appropriate to use a material having properties of being able to secure a high selectivity relative to a wet etching chemical solution used in the later process (a resistance to the etching chemical solution), forming no intermediate product with the AlGaInP semiconductor layer and having a high controllability of the film thickness at the time of forming the film. Specific examples thereof can include not only the $SiO_2$ film but also films capable of serving as the ridge lateral wall protective layer suitably such as a dielectric film of SiN, $Al_2O_3$ or the like, a semiconductor layer of GaAs, AlGaAs or the like, a metal film and an organic film that have the above-described properties.

Examples of a method of forming these films can include CVDs and PVDs. In the present embodiment, the plasma CVD is particularly preferable because it can form films with high thickness uniformity easily.

Although the $SiO_2$ films 128 and 129 used in Embodiment 2 are each a single layer, it also may include a plurality of layers as necessary, without any particular limitation.

Subsequently, as shown in FIGS. 2E(t-3) and 2F(u-3), the $SiO_2$ films 128 and 129 in the region other than the ridge lateral wall surfaces are removed by dry etching, thus forming $SiO_2$ lateral wall protective layers 130 and 131.

As the dry etching, it is possible to employ dry etching capable of removing the $SiO_2$ films 128 and 129 in a region other than the ridge lateral surfaces suitably, for example, RIE (Reactive Ion Etching), ICP, ECR or the like. Also, a CF-based gas such as a mixed gas of $CF_4$ and $CHF_3$ is used as the etching gas.

In Embodiment 2, RIE is employed, and the mixed gas of $CF_4$, $CHF_3$ and $O_2$ is used as the etching gas. Further, as the condition for the dry etching, the contents of $CF_4$ and $CHF_3$ in the mixed gas respectively are 1% to 10% and 30% to 50% by volume, the pressure is 40 to 60 Pa, and the stage temperature is 10° C. to 20° C. However, there is no particular limitation on them, and any dry etching condition that can remove the $SiO_2$ films 128 and 129 in the region other than the ridge lateral surfaces can be adopted suitably.

Whether the wet etching in the direction perpendicular to the substrate surface has stopped can be judged by visual observation of an interference pattern in the etching region on the surface of the semiconductor substrate. When the p-type $Ga_{0.5}In_{0.5}P$ etching stop layer 106 is exposed, the etching speed in the direction perpendicular to the substrate surface drops precipitously, so that the uniformity of the film thickness on the substrate surface improves. Consequently, the interference pattern in the etching region stops changing. In this way, it is possible to determine that the etching in the direction perpendicular to the substrate surface has stopped.

Although Embodiment 2 uses the hydrochloric acid-based chemical solution as the chemical solution for wet-etching the p-type $(Al_{0.7}Ga_{0.3})_{0.5}In_{0.5}P$ second cladding layer 108, there is no particular limitation on this. Any chemical solution may be used as long as it has a high selectivity relative to the $SiO_2$ lateral wall protective layers 130 and 131 and the p-type $Ga_{0.5}In_{0.5}P$ etching stop layer 106, and a sulfuric acid-based chemical solution may be used, for example.

Here, since the $SiO_2$ lateral wall protective layers 130 and 131 are highly resistant to the hydrochloric acid-based chemical solution, the regions provided with these lateral wall protective layers on the ridge lateral surfaces are not etched, so that no side etching occurs in top portions of the ridge lateral walls (portions to be the first surfaces).

On the other hand, as shown in FIGS. 2E(t-4) and 2F(u-4), the regions without the $SiO_2$ lateral wall protective layers 130 and 131 on the ridge lateral surfaces (a skirt portion of the ridge) are etched isotropically.

Also, at this time, the side etching amount and the thicknesses of the $SiO_2$ lateral wall protective layers 130 and 131 are adjusted so that the ridge lateral wall surfaces (the second surfaces and the third intermediate surfaces) protrude toward the outside of the ridge on both sides of the ridge. Here, when the ridge lateral wall surfaces are formed into a shape denting toward the inside of the ridge, the ridge shape similar to that shown in FIG. 2B(k) in Embodiment 1 can be formed.

Here, immediately after the wet etching in the direction perpendicular to the substrate surface stops, the ridge lateral surfaces in the regions without the $SiO_2$ lateral wall protective layers 130 and 131 have a curved inclined surface in a cross-section perpendicular to the stripe direction of the ridge. Thus, it is preferable to continue the wet etching until the ridge lateral surfaces in the regions without the $SiO_2$ lateral wall protective layers 130 and 131 (second ridge lateral wall surfaces 133 and 135) become substantially linear. Although a part of the wet etching process carried out until the second ridge lateral wall surfaces 133 and 135 achieve substantially linear inclined surfaces in the cross-section is referred to as an "additional etching" for easy understanding, the above-described wet etching does not have to be carried out at two stages but only has to be carried out until the second ridge lateral wall surfaces 135 achieve substantially linear inclined surfaces in their cross-section. Incidentally, the amount of this additional etching may be selected suitably according to the kind and mixture ratio of the chemical solutions.

Subsequently, as shown in FIGS. 2E(t-5) and 2F(u-5), the $SiO_2$ lateral wall protective layers 130 and 131 are removed using a hydrofluoric acid-based chemical solution.

In Embodiment 2, since the $SiO_2$ stripe 114 is set to be thicker than the $SiO_2$ lateral wall protective layers 130 and 131 by 100 to 300 nm, the $SiO_2$ lateral wall protective layers 130 and 131 can be removed alone by stopping the etching using the hydrofluoric acid-based chemical solution by time control.

Although Embodiment 2 uses the wet etching technique for removing the $SiO_2$ lateral wall protective layers 130 and 131, there is no particular limitation to the wet etching. According to the material of the lateral wall protective layers, chemical dry etching (in the following, referred to as CDE) or the like should be selected suitably. Here, it is appropriate to employ an etching technique capable of removing the $SiO_2$ lateral wall protective layers 130 and 131 selectively according to the material of the lateral wall protective layers.

Next, as shown in FIG. 2E(t-9) and 2F(u-8), using the $SiO_2$ stripe 114 as a mask, an n-type $Al_{0.5}In_{0.5}P$ current blocking layer 138 is grown selectively to achieve a thickness of 0.2 to 0.4 μm by MOCVD. Subsequently, using the $SiO_2$ stripe 114 as a mask, an n-type GaAs cap layer 139 is grown selectively to achieve a thickness of 0.1 to 0.2 μm by MOCVD.

It should be noted that, before growing the n-type $Al_{0.5}In_{0.5}P$ current blocking layer 107, a surface treatment with a sulfuric acid chemical solution is carried out for removing a damaged layer of the ridge lateral walls. At this time, the ridge lateral walls are etched in the range of about 15 nm to 40 nm. Also, the chemical solution for the surface treatment may be a mixture solution of hydrochloric acid and water.

Incidentally, as to the current blocking layer, there is an expression "a current blocking layer formed in a region except for at least a part on the ridge" in the above description. This means that either the current blocking layer is not formed on an upper surface of the ridge or, though not shown in the figure, the current blocking layer may cover the vicinities of both end portions in a longitudinal direction on the upper surface of the ridge extending like a stripe. The latter case is rather preferable.

Next, as shown in FIGS. 2E(t-10) and 2F(u-9), after removing the SiO$_2$ stripe 114 with a hydrofluoric acid-based chemical solution or the like, a p-side electrode 140 and an n-side electrode 141 are formed by vacuum evaporation, thus completing a ridge stripe semiconductor laser wafer. The material of the p-side electrode 140 can be Ti/Pt/Au, for example, and the material of the n-side electrode 141 can be AuGe/Ni/Au, for example.

Incidentally, although Embodiment 2 uses the n-type Al$_{0.5}$In$_{0.5}$P current blocking layer 138, it also may use a dielectric film of SiN, SiO$_2$ or the like. In this case, the n-type GaAs cap layer 139 does not need to be grown.

Figure 2I:
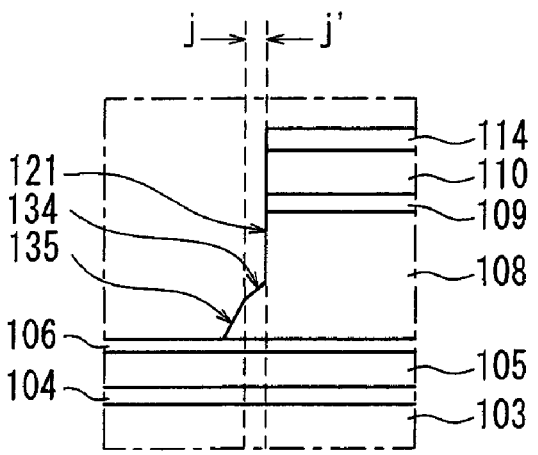
FIG. 2I is a partially enlarged view showing the ridge and the region near the skirt portion thereof in the process (t-5) in FIG. 2E.
Figure 2J:
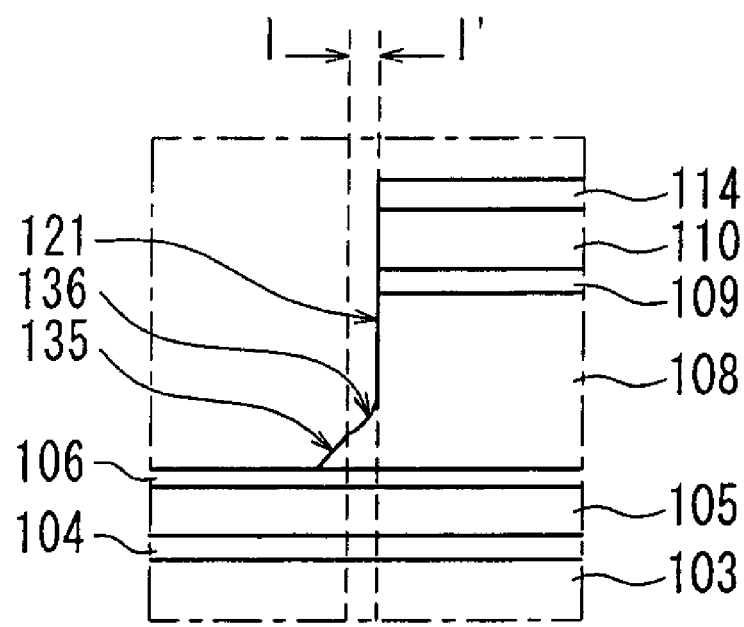
FIG. 2J is a partially enlarged view showing the ridge and the region near the skirt portion thereof in the process (u-5) in FIG. 2F.

In the ridge-shaped stripe formed in Embodiment 2, as shown in FIGS. 2I and 2J, third inclined intermediate surfaces 134 and 136 respectively are formed between the first ridge lateral wall surface 121 and the second ridge lateral wall surface 135. Here, FIG. 2I is an enlarged view showing a region 132 near the ridge and the skirt portion thereof in FIG. 2E(t-5), and FIG. 2J is an enlarged view showing a region 133 near the ridge and the skirt portion of the ridge in FIG. 2F(u-5). The third inclined intermediate surface 134 is linear, and the third inclined intermediate surface 136 is curved (a curved shape that is convex toward the inside of the ridge), with both being inclined obliquely downward in a direction of the outside of the ridge. Thus, compared with the step 117 substantially parallel with the surface of the semiconductor substrate in Embodiment 1, it is possible to suppress an abrupt change in a material, namely, an abrupt change in the refractive index in the skirt portion of the ridge when seen spatially. Therefore, it becomes possible to suppress the disturbance of NFP of a laser beam and prevent the deformation of FFP. In particular, according to Embodiment 2, the above-described effects can be achieved even in the case where the width of the skirt portion of the ridge exceeds 0.2 µm. Here, the "width of the skirt portion of the ridge" is a horizontal distance from the first ridge lateral wall surface 121 to the portion where the second ridge lateral wall surface 135 contacts the etching stop layer 106 shown in FIG. 2I, for example.

Here, in Embodiment 2, it is necessary that (dimension of post-dry etching lateral wall surface as third surface along direction parallel with substrate surface)≧(thickness of lateral wall protective layer)−(side etching amount)≧0 by forming the ridge lateral wall surfaces so as to protrude toward the outside of the ridge on both sides of the ridge and adjusting the side etching amount and the thickness of the lateral wall protective layers. For example, in FIG. 2G in Embodiment 2, (the dimension of the post-dry etching lateral wall surface 123 as the third surface along the direction parallel with the substrate surface, i.e., [h-h'])≧(the thickness of the SiO$_2$ lateral wall protective layer 130)−(the side etching amount)≧0. Also, smaller dimensions of the third intermediate surfaces 134 along the direction parallel with the substrate surface, i.e., the dimensions j-j' and k-k' (see FIG. 2E(t-5)) are more preferable, and it is desired that these dimensions be not greater than 0.2 µm and, more preferably, not greater than 0.1 µm. This is because, within this range, the third intermediate surface does not affect emission light adversely. On the other hand, in the case where (the thickness of the SiO$_2$ lateral wall protective layer 130)−(the side etching amount)≧(h-h')≧0, although the ridge lateral wall surfaces protrude toward the outside of the ridge, a step 137 that is formed of a part of the post-dry etching bottom surface 122 and substantially parallel with the substrate surface is formed between the third intermediate surface 134 and the second ridge lateral wall surface 135 as shown in FIG. 2E(t-6). When the length of this step 137 exceeds 0.2 µm, the deformation of FFP caused by the disturbance of NFP of a laser beam may occur as described above. Thus, it is desired that the dimension of the third inclined intermediate surface along the direction parallel with the substrate surface and the length of the step 137 be not greater than 0.2 µm and, more preferably, not greater than 0.1 µm. Incidentally, similarly to FIG. 2E, (the dimension of the second post-dry etching lateral wall surface 124 along the direction parallel with the substrate surface, i.e., [i-i'])≧(the thickness of the SiO$_2$ lateral wall protective layer 131)−(the side etching amount)≧0 also in the configuration shown in FIG. 2F (see FIG. 2H). Further, smaller dimensions of the third inclined intermediate surfaces 136 along the direction parallel with the substrate surface, i.e., the dimensions l-l' and m-m' (see FIG. 2F(u-5) and FIG. 2J) are more preferable, and it is desired that these dimensions be not greater than 0.2 µm and, more preferably, not greater than 0.1 µm.

In the case of using the off-angled semiconductor substrate, the amounts of side etching are different on both sides of the ridge. Considering these side etching amounts, it is desired to set (dimension of post-dry etching lateral wall surface as third surface along direction parallel with substrate surface)≧(thickness of lateral wall protective layer)−(side etching amount)≧0 on both sides of the ridge so as to achieve the ridge shape whose lateral wall surfaces protrude toward the outside of the ridge.

Incidentally, in Embodiments 1 and 2, the off-angled n-type GaAs substrate 102 whose substrate orientation is tilted by 100 in a [011] direction from a (001) plane is used. However, the present invention can be applied regardless of the off-angle of the substrate.

Embodiment 3

Figure 2K:
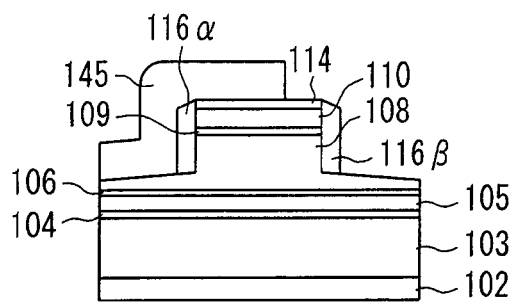
FIG. 2K is a sectional view showing a process in another embodiment of the present invention corresponding to the process (e) and thereafter in FIG. 2A.
Figure 2K:
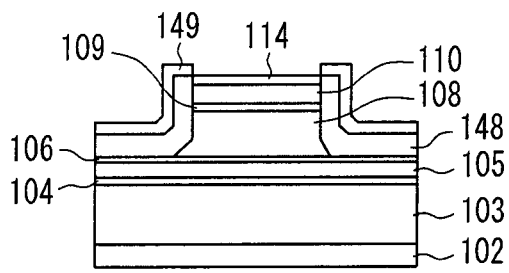
Figure 2K:
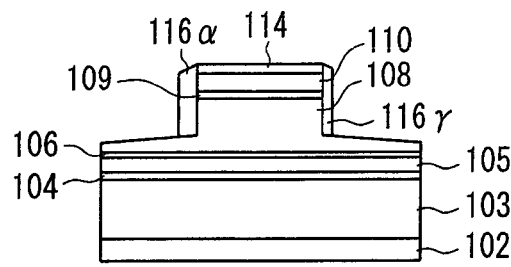
Figure 2K:
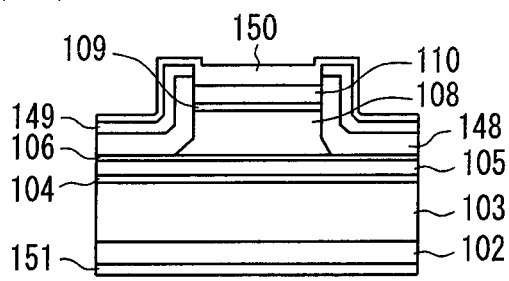
Figure 2K:
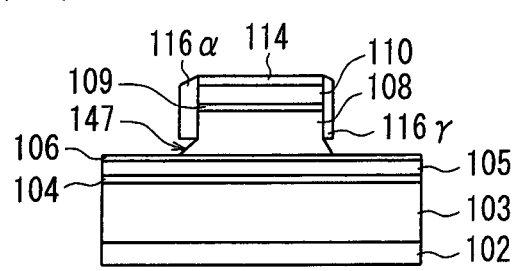
Figure 2K:
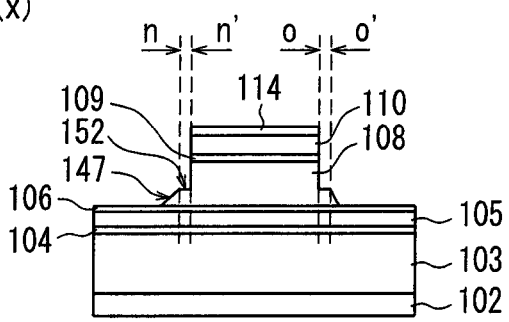
Figure 2K:
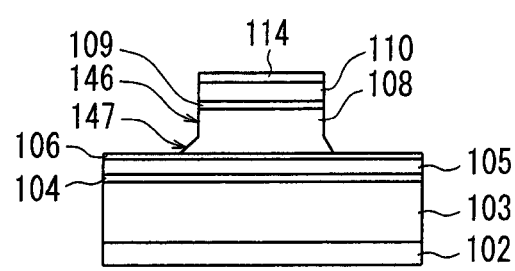
Figure 3:
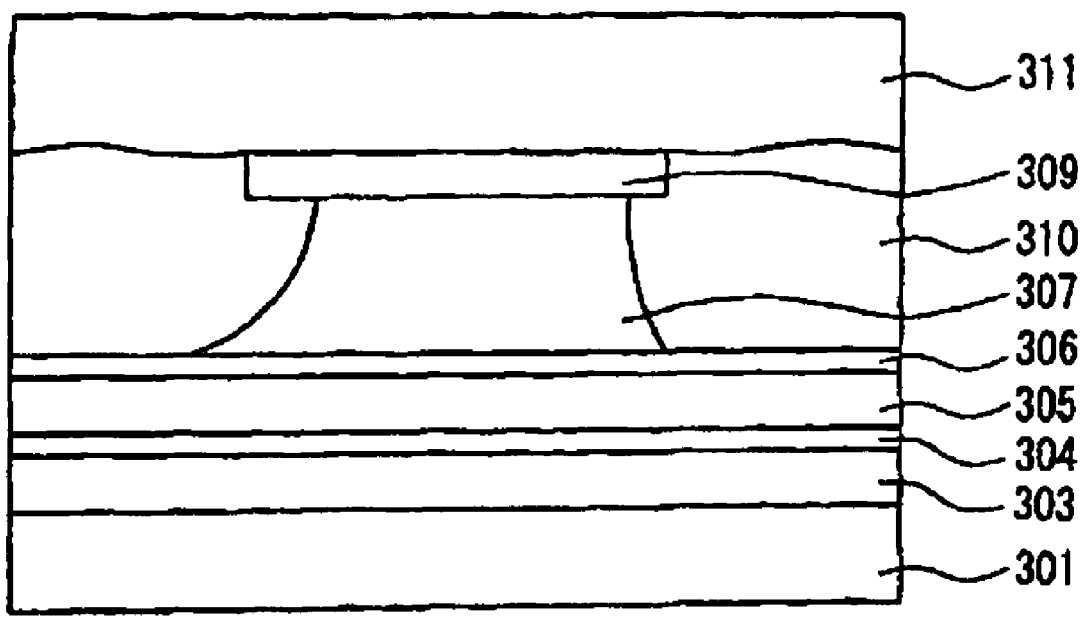
FIG. 3 is a sectional view showing a structure of an embodiment of a conventional ridge stripe semiconductor laser device.

FIGS. 2K(w-1) to (w-6) and 2K(x) are sectional views showing manufacturing processes of a ridge stripe semiconductor laser device in Embodiment 3. Embodiment 3 is limited to the case of using a semiconductor substrate in which the n-type GaAs substrate 102 is off-angled such that its substrate orientation is tilted from a (100) plane in a direction. As described in Embodiment 1, when an off-angled substrate is used, the intermediate step surfaces 117 always are formed as shown in FIGS. 2B(l), (m), (n) and 2C(p), for example. Accordingly, by suppressing the formation of the intermediate step surfaces 117 in Embodiment 1, Embodiment 3 aims at suppressing the change in the refractive index generated near a connection portion of the intermediate step surfaces 117 and the second surfaces 119 and further forming the ridge with excellent dimension controllability and reproducibility. Since Embodiment 3 has the processes up to forming the lateral wall protective layer 116 as shown in FIG. 2A(e) in common with Embodiment 1, only the processes thereafter will be described here. Also, the present embodiment has the configuration of the layers in common with Embodiment 1.

As shown in FIG. 2A(e), the SiO$_2$ film 115 in the region other than the ridge lateral wall surfaces is removed by dry etching, thus forming the SiO$_2$ lateral wall protective layers 116. Here, when the ridge is viewed from a [01-1] direction with the substrate facing downward in the cross-section perpendicular to the stripe direction of the formed ridge, a layer formed on the left side of the ridge out of the SiO$_2$ lateral wall protective layers 116 formed on both sides of the ridge is referred to as an SiO$_2$ lateral wall protective layer 116α, and a layer formed on the right side thereof is referred to as an SiO$_2$ lateral wall protective layer 116β (see FIG. 2K(w-1)).

Next, as shown in FIG. 2K(w-1), a resist pattern 145 is formed by a photolithography technique. Here, the shape of the resist pattern 145 is not limited to this. Any other shape is appropriate as long as a whole of the SiO$_2$ lateral wall protective layer 116α or a part thereof closer to the lower end of the ridge is covered and a whole of the SiO$_2$ lateral wall protective layer 116β or a part thereof closer to the lower end of the ridge is exposed.

Subsequently, as shown in FIG. 2K(w-2), the SiO$_2$ lateral wall protective layer 116β is etched to be thinner by 20 nm to 50 nm using a hydrofluoric acid-based chemical solution, followed by removing the resist pattern 145. Here, the SiO$_2$ lateral wall protective layer 116β that has been made thinner by the etching is referred to as an SiO$_2$ lateral wall protective layer 116γ.

Although the SiO$_2$ lateral wall protective layer 116β is etched by 20 nm to 50 nm to be thinner in Embodiment 3, this etching amount is not limited to this but may be changed suitably according to the amount of side etching that is caused under the SiO$_2$ lateral wall protective layers 116α and 116γ at the time of wet-etching the remaining portion of the p-type second cladding layer 108 until the p-type etching stop layer 106 is reached in the subsequent process and determined by the off-angle of the n-type GaAs substrate 102.

Also, since a hydrofluoric acid-based chemical solution with a low etching speed, for example, a chemical solution whose hydrofluoric acid concentration is about ½ to ⅟₁₀ of that of the chemical solution used when etching the SiO$_2$ stripe 114 is used with respect to the SiO$_2$ lateral wall protective layer 116β in Embodiment 3, it is possible to adjust the thickness of the SiO$_2$ lateral wall protective layer 116γ without losing the SiO$_2$ lateral wall protective layer 116γ by time control. Further, in the case where a part of the SiO$_2$ stripe 114 is exposed from the resist pattern 145, the SiO$_2$ stripe 114 in the exposed part also is etched but is not lost because the SiO$_2$ stripe 114 is set to be thicker than the SiO$_2$ lateral wall protective layer 116β by 100 to 300 nm. Moreover, although a step (a difference in level) is formed in the SiO$_2$ stripe 114 by the etching using the hydrofluoric acid-based chemical solution, there is no problem as long as the SiO$_2$ stripe 114 is not lost.

Although Embodiment 3 uses the wet etching technique for making the SiO$_2$ lateral wall protective layer 116β thinner, there is no particular limitation on the wet etching. According to the material of the lateral wall protective layer, chemical dry etching (in the following, referred to as CDE) or the like should be selected suitably. Here, it is appropriate to employ an etching technique capable of etching the SiO$_2$ lateral wall protective layer 116β selectively according to the material of the lateral wall protective layer.

Next, as shown in FIG. 2K(w-3), using a hydrochloric acid-based chemical solution, the p-type (Al$_{0.7}$Ga$_{0.3}$)$_{0.5}$In$_{0.5}$P second cladding layer 108 is etched until the p-type Ga$_{0.5}$In$_{0.5}$P etching stop layer 106 is reached. Here, since the p-type Ga$_{0.5}$In$_{0.5}$P etching stop layer 106 is resistant to the hydrochloric acid-based chemical solution, the etching in a direction perpendicular to the substrate surface stops when this layer is exposed. Here, in Embodiment 3, a mixture solution of tartaric acid, hydrochloric acid and water is used as the hydrochloric acid-based chemical solution. The tartaric acid content in the chemical solution is 30% to 50% by volume, and the hydrochloric acid content therein is 15% to 35% by volume.

Whether the wet etching in the direction perpendicular to the substrate surface has stopped can be judged by visual observation of an interference pattern in the etching region on the surface of the semiconductor substrate. When the p-type Ga$_{0.5}$In$_{0.5}$P etching stop layer 106 is exposed, the etching speed in the direction perpendicular to the substrate surface drops precipitously, so that the uniformity of the film thickness on the substrate surface improves. Consequently, the interference pattern in the etching region stops changing. In this way, it is possible to determine that the etching in the direction perpendicular to the substrate surface has stopped.

Although Embodiment 3 uses the hydrochloric acid-based chemical solution as the chemical solution for wet-etching the p-type (Al$_{0.7}$Ga$_{0.3}$)$_{0.5}$In$_{0.5}$P second cladding layer 108, there is no particular limitation to this. Any chemical solution may be used as long as it has a high selectivity relative to the SiO$_2$ lateral wall protective layers 116α and 116γ and the p-type Ga$_{0.5}$In$_{0.5}$P etching stop layer 106, and a sulfuric acid-based chemical solution may be used, for example.

Here, since the SiO$_2$ lateral wall protective layers 116α and 116γ are highly resistant to the hydrochloric acid-based chemical solution, regions provided with these layers on the ridge lateral surfaces are not etched, so that no side etching occurs in the regions provided with the SiO$_2$ lateral wall protective layers 116α and 116γ (first ridge lateral wall surfaces 146).

On the other hand, the regions without the SiO$_2$ lateral wall protective layers 116α and 116γ on the ridge lateral surfaces (a skirt portion of the ridge) are etched isotropically.

Here, immediately after the wet etching in the direction perpendicular to the substrate surface stops, the ridge lateral surfaces in the regions without the SiO$_2$ lateral wall protective layers 116α and 116γ have a curved inclined surface in a cross-section perpendicular to the stripe direction of the ridge. Thus, it is preferable to continue the wet etching until the ridge lateral surfaces in the regions without the SiO$_2$ lateral wall protective layers 116α and 116γ (second ridge lateral wall surfaces 147) become substantially linear. Although a part of the wet etching process carried out until the second ridge lateral wall surfaces 147 achieve substantially linear inclined surfaces in the cross-section, in other words, the (111) plane is exposed entirely is referred to as an "additional etching" for easy understanding, the above-described wet etching does not have to be carried out at two stages but only has to be carried out until the second ridge lateral wall surfaces 147 achieve substantially linear inclined surfaces in their cross-section. Incidentally, the amount of this additional etching may be selected suitably according to the kind and mixture ratio of the chemical solutions.

Subsequently, as shown in FIG. 2K(w-4), the SiO$_2$ lateral wall protective layers 116α and 116γ are removed using a hydrofluoric acid-based chemical solution.

In Embodiment 3, since the SiO$_2$ stripe 114 is set to be thicker than the SiO$_2$ lateral wall protective layers 116α and 116γ by 100 to 300 nm, the SiO$_2$ lateral wall protective layers 116α and 116γ can be removed alone by stopping the etching using the hydrofluoric acid-based chemical solution by time control.

Although Embodiment 3 uses the wet etching technique for removing the SiO$_2$ lateral wall protective layers 116α and 116γ, there is no particular limitation to the wet etching. According to the material of the lateral wall protective layers, CDE or the like should be selected suitably. Here, it is appropriate to employ an etching technique capable of removing the $SiO_2$ lateral wall protective layers 116α and 116γ selectively according to the material of the lateral wall protective layers.

Next, as shown in FIG. 2K(w-5), using the $SiO_2$ stripe 114 as a mask, an n-type $Al_{0.5}In_{0.5}P$ current blocking layer 148 is grown selectively to achieve a thickness of 0.2 to 0.4 μm by MOCVD. Subsequently, using the $SiO_2$ stripe 114 as a mask, an n-type GaAs cap layer 149 is grown selectively to achieve a thickness of 0.1 to 0.2 μm by MOCVD.

It should be noted that, before growing the n-type $Al_{0.5}In_{0.5}P$ current blocking layer 148, a surface treatment with a sulfuric acid chemical solution is carried out for removing a damaged layer of the ridge lateral walls. At this time, the ridge lateral walls are etched in the range of about 15 nm to 40 nm. Also, the chemical solution for the surface treatment may be a mixture solution of hydrochloric acid and water.

Incidentally, as to the current blocking layer, there is an expression "a current blocking layer formed in a region except for at least a part on the ridge" in the above description. This means that either the current blocking layer is not formed on an upper surface of the ridge or, though not shown in the figure, the current blocking layer may cover the vicinities of both end portions in a longitudinal direction on the upper surface of the ridge extending like a stripe. The latter case is rather preferable.

Next, as shown in FIG. 2K(w-6), after removing the $SiO_2$ stripe 114 with a hydrofluoric acid-based chemical solution or the like, a p-side electrode 150 and an n-side electrode 151 are formed by vacuum evaporation, thus completing a ridge stripe semiconductor laser wafer. The material of the p-side electrode 150 can be Ti/Pt/Au, for example, and the material of the n-side electrode 151 can be AuGe/Ni/Au, for example.

Incidentally, although Embodiment 3 uses the n-type $Al_{0.5}In_{0.5}P$ current blocking layer 148, it also may use a dielectric film of SiN, $SiO_2$ or the like. In this case, the n-type GaAs cap layer 149 does not need to be grown selectively.

The ridge-shaped stripe formed in Embodiment 3 has high perpendicularity and high symmetry, and an angle that the ridge lateral surfaces closer to the upper end of the ridge formed by the dry etching form with the surface of the n-type GaAs substrate 102 and an angle that the second ridge inclined surfaces closer to the lower end of the ridge formed by the wet etching form with the surface of the n-type GaAs substrate 102 are equivalent to those of the ridge-shaped stripe formed in Embodiment 1.

Also, in Embodiment 3, by setting (the thickness of the $SiO_2$ lateral wall protective layer 116α)=(the amount of side etching caused under the $SiO_2$ lateral wall protective layer 116α) and (the thickness of the $SiO_2$ lateral wall protective layer 116γ)=(the amount of side etching caused under the $SiO_2$ lateral wall protective layer 116γ), no third intermediate step surface or the like is formed at the border between the ridge lateral wall surface formed by the dry etching and the ridge lateral wall surface formed by the wet etching, such that the first surface and the second surface are connected directly, despite the use of the off-angled substrate. Here, in the case of using the off-angled substrate, the amounts of side etching caused under the $SiO_2$ lateral wall protective layers 116α and 116γ at the time of wet-etching the p-type $(Al_{0.7}Ga_{0.3})_{0.5}In_{0.5}P$ second cladding layer 108 satisfy (the amount of side etching caused under the $SiO_2$ lateral wall protective layer 116α)>(the amount of side etching caused under the $SiO_2$ lateral wall protective layer 116γ), and the difference between these side etching amounts increases in keeping with the off-angle of the substrate. Thus, it is appropriate to select the thicknesses of the $SiO_2$ lateral wall protective layers 116α and 116γ according to the off-angle of the substrate. Incidentally, in Embodiment 3, the third intermediate step surfaces similar to those in Embodiment 1 sometimes are formed between the first ridge lateral wall surfaces 146 and the second ridge lateral wall surfaces 147 owing to the variations in the amounts of side etching caused under the $SiO_2$ lateral wall protective layers 116α and 116γ and the thicknesses of the $SiO_2$ lateral wall protective layers 116α and 116γ. However, by setting (the thicknesses of the $SiO_2$ lateral wall protective layers 116α and 116γ)≧(the side etching amounts), intermediate step surfaces 152 protruding toward the outside of the ridge are formed as shown in FIG. 2K(x), so that the ridge having small dimensions n-n' and o-o' of the third intermediate step surfaces 152 can be formed with excellent dimension controllability and reproducibility.

As described above, in accordance with the present invention, it is possible to form the ridge with excellent dimensional accuracy aiming at the removal of the layer damaged by plasma by the dry etching while suppressing the side etching on the lateral surfaces of the ridge with the $SiO_2$ lateral wall protective layers 116, 130, 131 and 116α, 116γ and to form a right-left symmetrical ridge shape in the cross-section perpendicular to the longitudinal direction (stripe direction) of the ridge. In addition, since a substantial part of the p-type $(Al_{0.7}Ga_{0.3})_{0.5}In_{0.5}P$ second cladding layer 108 is dry-etched, the ridge shape with high perpendicularity and high symmetry can be achieved in the cross-section perpendicular to the longitudinal direction (stripe direction) of the ridge. These effects lead to the improvement of the kink level and yield of the resultant ridge stripe semiconductor laser device.

Furthermore, in accordance with the present invention, the substantially linear inclined surfaces (the second ridge lateral wall surfaces) are formed. In other words, the number of exposed crystal faces (the number of different kinds of exposed crystal faces) is reduced by the wet etching in the skirt portion of the ridge, which is close to the emission position and most influential on the emission light, whereby the crystallinity of the current blocking layer formed of the semiconductor layer such as an n-type AlInP semiconductor layer in the skirt portion of the ridge can be improved. Also, in the case of the current blocking layer formed of the dielectric film of SiN, $SiO_2$ and the like, its coverage can be improved. These effects lead to the improvement of characteristics of the semiconductor laser element such as an increase in the uniformity of the horizontal radiation angle of the laser beam and a decrease in the threshold current and the operating current.

Moreover, although the AlGaInP red semiconductor laser device is used in the present embodiment, there is no particular limitation on this. The present invention can be applied to all ridge stripe semiconductor laser devices utilizing a mixed crystal compound semiconductor. It is needless to say that the ridge stripe semiconductor laser device according to the present invention includes laser devices of not only types having one stripe-shaped ridge but also types having a plurality of stripe-shaped ridges on a single substrate, and among them, types emitting laser beams with different wavelengths, for example, laser devices of types emitting infrared light and red light.

Example 1

The following is a more detailed description of the present invention by way of examples for making it still easier to understand the present invention, with reference to FIGS. 1, 2A(a) to (e) used in Embodiment 1 described above and 2C(o) to (r) subsequent thereto. However, the present invention is not limited to the examples below but can be applied to all ridge stripe semiconductor laser devices. Incidentally, FIG. 2C(o) to (r) is a sectional view showing processes corresponding to FIG. 2A(f) to (i) in the case of using a semiconductor substrate having a specific off-angle as the semiconductor substrate. Since the processes prior to FIG. 2C(o) are the same as those shown in FIG. 2A(a) to (e), the following description will refer to FIGS. 2A(a) to (e) and 2C(o) to (r).

First, as shown in FIGS. 1 and 2A(a), an n-type $(Al_{0.7}Ga_{0.3})_{0.5}In_{0.5}P$ cladding layer 103 (with a thickness of 2 μm), a $Ga_{0.5}In_{0.5}P$ active layer 104 (with a thickness of 5 nm), a p-type $(Al_{0.7}Ga_{0.3})_{0.5}In_{0.5}P$ first cladding layer 105 (with a thickness of 0.2 μm), a p-type $Ga_{0.5}In_{0.5}P$ etching stop layer 106 (with a thickness of 10 nm), a p-type $(Al_{0.7}Ga_{0.3})_{0.5}In_{0.5}P$ second cladding layer 108 (with a thickness of 1.2 μm), a p-type $Ga_{0.5}In_{0.5}P$ intermediate layer 109 (with a thickness of 50 nm) and a p-type GaAs contact layer 110 (with a thickness of 0.2 μm) were formed in this order on an n-type GaAs substrate 102 (with a thickness of 450 μm) by MOCVD. Next, an $SiO_2$ film 113 (with a thickness of 0.6 μm) was formed on the p-type GaAs contact layer 110 by an atmospheric pressure CVD.

Incidentally, the n-type GaAs substrate 102 used here was an off-angled substrate whose substrate orientation was tilted by 10° from a (100) plane in a [011] direction.

Next, as shown in FIG. 2A(b), an $SiO_2$ stripe 114 (with a width of 2 μm) was formed by a photolithography technique and a dry etching technique.

Subsequently, as shown in FIG. 2A(c), using the $SiO_2$ stripe 114 as a mask, the p-type $(Al_{0.7}Ga_{0.3})_{0.5}In_{0.5}P$ second cladding layer 108, the p-type $Ga_{0.5}In_{0.5}P$ intermediate layer 109 and the p-type GaAs contact layer 110 were dry-etched to a position 300 nm above the p-type $Ga_{0.5}In_{0.5}P$ etching stop layer 106. Here, the dry etching was stopped by time control.

As the dry etching technique, an ICP method was used. Also, as the etching gas, a mixed gas of $SiCl_4$ and Ar was used. As the dry etching condition, the content of $SiCl_4$ in the mixed gas was about 11% by volume, the pressure inside a chamber was about 0.6 Pa, the bias power of a lower electrode was 120 W, and the ICP power was 200 W.

Next, as shown in FIG. 2A(d), an $SiO_2$ film 115 with a thickness of 300 nm was grown on an entire surface (including ridge lateral surfaces) of an intermediate obtained in FIG. 2A(c) by plasma CVD.

Subsequently, as shown in FIG. 2A(e), the $SiO_2$ film 115 in the region other than the ridge lateral surfaces was removed by dry etching, thus forming $SiO_2$ lateral wall protective layers 116.

Here, RIE was employed for the dry etching. As the etching gas, a mixed gas of $CF_4$, $CHF_3$ and $O_2$ was used. As the condition for the dry etching, the contents of $CF_4$ and $CHF_3$ in the mixed gas respectively were 5% and 40% by volume, and the pressure was 50 Pa.

Thereafter, using a hydrofluoric acid-based chemical solution, a surface treatment of the substrate was carried out for the purpose of removing the residual $SiO_2$ film 115 in the region other than the ridge lateral walls.

Next, using a mixture chemical solution of tartaric acid and hydrochloric acid, the p-type $(Al_{0.7}Ga_{0.3})_{0.5}In_{0.5}P$ second cladding layer 108 was etched until the p-type $Ga_{0.5}In_{0.5}P$ etching stop layer 106 was reached. Here, since the p-type $Ga_{0.5}In_{0.5}P$ etching stop layer 106 was resistant to the hydrochloric acid-based chemical solution, the etching in a direction perpendicular to the substrate surface stops when this layer was exposed. By visual observation of an interference pattern in the etching region, it was determined that the etching in the direction perpendicular to the substrate surface was stopped.

Since the $SiO_2$ lateral wall protective layers 116 were highly resistant to the hydrochloric acid-based chemical solution, regions provided with these layers on the ridge lateral wall surfaces were not etched, so that no side etching occurred in top portions of the ridge (first ridge lateral wall surfaces 118).

On the other hand, as shown in FIG. 2C(o), the regions without the $SiO_2$ lateral wall protective layers 116 on the ridge lateral wall surfaces were etched isotropically. Since the p-type $Ga_{0.5}In_{0.5}P$ etching stop layer 106 was formed, the etching in the direction perpendicular to the substrate surface no longer proceeded once the surface of this etching stop layer 106 was exposed. However, after this was determined by the visual observation of the interference pattern in the etching region as described above, the wet etching was continued for a period equal to that in which, when the p-type $(Al_{0.7}Ga_{0.3})_{0.5}In_{0.5}P$ second cladding layer was a material to be etched, this layer was etched by 200 nm along the direction perpendicular to the substrate surface in order to form a substantially linear inclined surface (a second ridge lateral wall surface 119) in the skirt portion of the ridge (additional etching). Although the additional etching was continued as described above, the etching did not proceed in the direction perpendicular to the substrate surface because the p-type $Ga_{0.5}In_{0.5}P$ etching stop layer 106 was formed. However, the inclined surface (the second ridge lateral wall surface 119) in the skirt portion of the ridge became substantially linear in the cross-section perpendicular to the stripe direction of the ridge.

Subsequently, as shown in FIG. 2C(p), the $SiO_2$ lateral wall protective layers 116 alone were removed using a hydrofluoric acid-based chemical solution by time control.

Next, as shown in FIG. 2C(q), using the $SiO_2$ stripe 114 as a mask, an n-type $Al_{0.5}In_{0.5}P$ current blocking layer 107 (with a thickness of 0.3 μm) was grown selectively by MOCVD. It should be noted that, before growing the n-type $Al_{0.5}In_{0.5}P$ current blocking layer 107, a surface treatment with a sulfuric acid chemical solution (97% sulfuric acid) was carried out for removing a damaged layer of the ridge lateral walls. At this time, the ridge lateral walls were etched by about 25 nm on one side. Subsequently, using the $SiO_2$ stripe 114 as a mask, an n-type GaAs cap layer 111 (with a thickness of 0.17 μm) was grown selectively by MOCVD.

Subsequently, as shown in FIG. 2C(r), after removing the $SiO_2$ stripe 114 with a hydrofluoric acid-based chemical solution, a Ti/Pt/Au p-side electrode 112 (with a thickness of 50/100/50 nm) and an AuGe/Ni/Au n-side electrode 101 (with a thickness of 100/50/400 nm) were formed by vacuum evaporation, thus completing a ridge stripe semiconductor laser wafer.

The resultant ridge-shaped stripe had high perpendicularity and high symmetry, and an angle that the ridge lateral surfaces closer to an upper end of the ridge (the first ridge lateral wall surfaces 118) form with the surface of the n-type GaAs substrate 102 was 86°. On the other hand, angles that the ridge lateral surfaces closer to a lower end of the ridge (the second ridge lateral wall surfaces 119) form with the surface of the n-type GaAs substrate 102 were different on both sides of the ridge because of the use of the n-type GaAs substrate 102 with an off-angle of about 10°, and respectively were 40° and 62°.

Moreover, in the ridge top portion formed in the present example, the p-type $Ga_{0.5}In_{0.5}P$ intermediate layer 109 and the p-type GaAs contact layer 110 did not protrude to form eaves-like overhangs. Thus, at the time of growing the n-type $Al_{0.5}In_{0.5}P$ current blocking layer 107, cavities were not formed.

The resultant ridge stripe semiconductor laser wafer had the ridge lateral surfaces having excellent perpendicularity with respect to the substrate surface and the ridge cross-section having excellent right-left symmetry. Also, since the kink level reached 300 mW, which was a maximum measurable value of the measurement instrument that was used, it was confirmed that the kink level exceeded 300 mW at 25° C., showing that a ridge stripe semiconductor laser having an excellent performance was formed in a stable manner.

The case where an SiN dielectric film instead of the n-type $Al_{0.5}In_{0.5}P$ was used as the current blocking layer 107 was carried out similarly. In this case, the conditions were the same except that the n-type GaAs cap layer 111 did not have to be grown. Then, a ridge stripe semiconductor laser having a performance equivalent to that in the case of using the n-type $Al_{0.5}In_{0.5}P$ as the current blocking layer 107 was formed in a stable manner.

Furthermore, in the present example, the border between the ridge lateral surface formed by the dry etching and the ridge lateral surface formed by the wet etching on one side was a bent portion in which the first ridge lateral wall surface and the second ridge lateral wall surface were connected with a certain angle. At the border between these ridge lateral surfaces on the other side, the step portion serving as the third surface was formed between the first ridge lateral wall surface and the second ridge lateral wall surface, with the step 117 having a dimension (g-g') of 0.07 μm. This was because the present example corresponded to the case where the off-angled semiconductor substrate as described in FIG. 2B(l) was used, the larger amount (corresponding to the second ridge lateral wall surface on the left side in FIG. 2C(o) and (p)) out of the amounts of side etching generated on both sides of the ridge in the wet etching processes was equal to the thickness of the lateral wall protective layer and the smaller amount (corresponding to the second ridge lateral wall surface on the right side in FIG. 2C(o) and (p)) out of the same was smaller than the thickness of the lateral wall protective layer.

Example 2

Now, the present invention will be described more in detail by way of examples for making it still easier to understand the present invention, with reference to FIGS. 2A(a) to (b) and 2E(t-1) to (t-2) and (t-7) to (t-10) subsequent thereto used in Embodiment 2 described above. However, the present invention is not limited to the examples below but can be applied to all ridge stripe semiconductor laser devices.

First, as shown in FIG. 2A(a), an n-type $(Al_{0.7}Ga_{0.3})_{0.5}In_{0.5}P$ cladding layer 103 (with a thickness of 2 μm), a $Ga_{0.5}In_{0.5}P$ active layer 104 (with a thickness of 5 nm), a p-type $(Al_{0.7}Ga_{0.3})_{0.5}In_{0.5}P$ first cladding layer 105 (with a thickness of 0.2 μm), a p-type $Ga_{0.5}In_{0.5}P$ etching stop layer 106 (with a thickness of 10 nm), a p-type $(Al_{0.7}Ga_{0.3})_{0.5}In_{0.5}P$ second cladding layer 108 (with a thickness of 1.2 μm), a p-type $Ga_{0.5}In_{0.5}P$ intermediate layer 109 (with a thickness of 50 nm) and a p-type GaAs contact layer 110 (with a thickness of 0.2 μm) were formed in this order on an n-type GaAs substrate 102 (with a thickness of 450 μm) by MOCVD. Next, an $SiO_2$ film 113 (with a thickness of 0.6 μm) was formed on the p-type GaAs contact layer 110 by an atmospheric pressure CVD.

Incidentally, the n-type GaAs substrate 102 used here was an off-angled substrate whose substrate orientation was tilted by 10° from a (100) plane in a [011] direction.

Next, as shown in FIG. 2A(b), an $SiO_2$ stripe 114 (with a width of 2 μm) was formed by a photolithography technique and a dry etching technique.

Subsequently, as shown in FIG. 2E(t-1), using the $SiO_2$ stripe 114 as a mask, the p-type $(Al_{0.7}Ga_{0.3})_{0.5}In_{0.5}P$ second cladding layer 108, the p-type $Ga_{0.5}In_{0.5}P$ intermediate layer 109 and the p-type GaAs contact layer 110 were dry-etched to a position 200 nm above the p-type $Ga_{0.5}In_{0.5}P$ etching stop layer 106. Here, the dry etching was stopped by time control.

As the dry etching technique, an ICP method was used. Also, as the etching gas, a mixed gas of $SiCl_4$ and Ar was used. As the dry etching condition, the content of $SiCl_4$ in the mixed gas was about 8% by volume, the pressure inside a chamber was about 0.4 Pa, the bias power of a lower electrode was 100 W, and the ICP power was 250 W. As a result, as shown in FIG. 2G, a post-dry etching lateral wall surface 123 serving as a third inclined intermediate surface was formed between a first post-dry etching lateral wall surface 121 and a post-dry etching bottom surface 122. The dry etching condition described above was a condition in which (1) the etching gas concentration was lower, (2) the power of the lower electrode was lower and (3) the pressure inside the chamber was lower than those in Example 1.

Since the gas flows poorly at the corner of the ridge bottom portion formed by the etching compared with other portions, the etching gas basically is supplied less sufficiently here compared with other portions. Consequently, the amount of dry etching is small at the corner, so that the third intermediate inclined surface tends to be formed as indicated by numeral 123 in FIG. 2G. Depending on the dry etching condition, it also is possible to form the curved third intermediate inclined surface as indicated by numeral 124 in FIG. 2H. In the present example, the etching gas concentration was lowered, whereby such a state was made more likely to occur. Also, in the present example, by lowering the bias power of the lower electrode, a potential at which ions contributing to the etching were pulled toward the substrate was reduced. In this way, the etching at the corner became still more insufficient, so that the third inclined intermediate lateral wall surface as indicated by numeral 123 in FIG. 2G was formed. Incidentally, since the ions contributing to the dry etching became less likely to travel straight, this was complemented by lowering the pressure.

Next, as shown in FIG. 2E(t-2), an $SiO_2$ film 128 with a thickness of 300 nm was grown on an entire surface (including ridge lateral surfaces) of an intermediate obtained in FIG. 2E(t-1) by plasma CVD.

Subsequently, as shown in FIG. 2E(t-7), the $SiO_2$ film 128 in the region other than the ridge lateral surfaces was removed by dry etching, thus forming $SiO_2$ lateral wall protective layers 130.

Here, RIE was employed for the dry etching. As the etching gas, a mixed gas of $CF_4$, $CHF_3$ and $O_2$ was used. As the condition for the dry etching, the contents of $CF_4$ and $CHF_3$ in the mixed gas respectively were 5% and 40% by volume, and the pressure was 50 Pa.

Thereafter, using a hydrofluoric acid-based chemical solution, a surface treatment of the substrate was carried out for the purpose of removing the residual $SiO_2$ film 128 in the region other than the ridge lateral walls.

Next, using a mixture chemical solution of tartaric acid and hydrochloric acid, the p-type $(Al_{0.7}Ga_{0.3})_{0.5}In_{0.5}P$ second cladding layer 108 was etched until the p-type $Ga_{0.5}In_{0.5}P$ etching stop layer 106 was reached. Here, since the p-type $Ga_{0.5}In_{0.5}P$ etching stop layer 106 was resistant to the hydrochloric acid-based chemical solution, the etching in a direction perpendicular to the substrate surface stops when this layer was exposed. By visual observation of an interference pattern in the etching region, it was determined that the etching in the direction perpendicular to the substrate surface was stopped.

Since the $SiO_2$ lateral wall protective layers 130 were highly resistant to the hydrochloric acid-based chemical solution, regions provided with these layers on the ridge lateral wall surfaces were not etched, so that no side etching occurred in top portions of the ridge (first ridge lateral wall surfaces 121).

On the other hand, as shown in FIG. 2E(t-7), the regions without the $SiO_2$ lateral wall protective layers 130 on the ridge lateral wall surfaces were etched isotropically. Since the p-type $Ga_{0.5}In_{0.5}P$ etching stop layer 106 was formed, the etching in the direction perpendicular to the substrate surface no longer proceeded once the surface of this etching stop layer 106 was exposed. However, after this was determined by the visual observation of the interference pattern in the etching region as described above, the wet etching was continued for a period equal to that in which, when the p-type $(Al_{0.7}Ga_{0.3})_{0.5}In_{0.5}P$ second cladding layer was a material to be etched, this layer was etched by 100 nm along the direction perpendicular to the substrate surface in order to form a substantially linear inclined surface (a second ridge lateral wall surface 135) in the skirt portion of the ridge (additional etching). Although the additional etching was continued as described above, the etching did not proceed in the direction perpendicular to the substrate surface because the p-type $Ga_{0.5}In_{0.5}P$ etching stop layer 106 was formed. However, the inclined surface (the second ridge lateral wall surface 135) in the skirt portion of the ridge became substantially linear in the cross-section perpendicular to the stripe direction of the ridge.

Subsequently, as shown in FIG. 2E(t-8), the $SiO_2$ lateral wall protective layers 130 alone were removed using a hydrofluoric acid-based chemical solution by time control. At this time, the border between the first ridge lateral wall surface 121 and the second ridge lateral wall surface 135 on one side was a bent portion in which the first ridge lateral wall surface and the second ridge lateral wall surface were connected directly with a certain angle. At the border between these ridge lateral wall surfaces on the other side, a linear third inclined intermediate surface 142 extending obliquely downward was formed between the first ridge lateral wall surface and the second ridge lateral wall surface, with the third inclined intermediate surface 142 having a width (p-p') of 0.06 μm.

Next, as shown in FIG. 2E(t-9), using the $SiO_2$ stripe 114 as a mask, an n-type $Al_{0.5}In_{0.5}P$ current blocking layer 138 (with a thickness of 0.3 μm) was grown selectively by MOCVD. It should be noted that, before growing the n-type $Al_{0.5}In_{0.5}P$ current blocking layer 138, a surface treatment with a sulfuric acid chemical solution (97% sulfuric acid) was carried out for removing a damaged layer of the ridge lateral walls. At this time, the ridge lateral walls were etched by about 25 nm on one side. Subsequently, using the $SiO_2$ stripe 114 as a mask, an n-type GaAs cap layer 139 (with a thickness of 0.17 μm) was grown selectively by MOCVD.

Subsequently, as shown in FIG. 2E(t-10), after removing the $SiO_2$ stripe 114 with a hydrofluoric acid-based chemical solution, a Ti/Pt/Au p-side electrode 140 (with a thickness of 50/100/50 nm) and an AuGe/Ni/Au n-side electrode 141 (with a thickness of 100/50/400 nm) were formed by vacuum evaporation, thus completing a ridge stripe semiconductor laser wafer.

The resultant ridge-shaped stripe had high perpendicularity and high symmetry, and an angle that the ridge lateral surfaces closer to an upper end of the ridge (the first ridge lateral wall surfaces 121) form with the surface of the n-type GaAs substrate 102 was 90°. On the other hand, angles that the ridge lateral surfaces closer to a lower end of the ridge (the second ridge lateral wall surfaces 135) form with the surface of the n-type GaAs substrate 102 were different on both sides of the ridge because of the use of the n-type GaAs substrate 102 with an off-angle of about 10°, and respectively were 40° (the second ridge lateral wall surface on the left side in FIG. 2E(t-8)) and 62° (the second ridge lateral wall surface on the right side in FIG. 2E(t-8)).

The resultant ridge stripe semiconductor laser wafer had the ridge lateral surfaces having excellent perpendicularity with respect to the substrate surface and the ridge cross-section having excellent right-left symmetry. Also, since the kink level reached 300 mW, which was a maximum measurable value of the measurement instrument that was used, it was confirmed that the kink level exceeded 300 mW at 25° C., showing that a ridge stripe semiconductor laser having an excellent performance was formed in a stable manner.

The case where an SiN dielectric film instead of the n-type $Al_{0.5}In_{0.5}P$ was used as the current blocking layer 138 was carried out similarly. In this case, the conditions were the same except that the n-type GaAs cap layer 139 did not have to be grown. Then, a ridge stripe semiconductor laser having a performance equivalent to that in the case of using the n-type $Al_{0.5}In_{0.5}P$ as the current blocking layer 138 was formed in a stable manner.

Furthermore, in the present example, the border between the ridge lateral surface formed by the dry etching and the ridge lateral surface formed by the wet etching (see FIG. 2E(t-8)) on one side was a bent portion in which the first ridge lateral wall surface and the second ridge lateral wall surface were connected directly with a certain angle. At the border between these ridge lateral surfaces on the other side, the third inclined intermediate surface 142 was formed between the first ridge lateral wall surface and the second ridge lateral wall surface, with the inclined intermediate surface 142 having an angle of 42° and a dimension (p-p') of 0.06 μm, thus forming a ridge that was not affected very much by the variation of the refractive index due to the presence of the inclined intermediate surface. This was because the present example corresponded to the case where the off-angled semiconductor substrate as described in FIG. 2B(l) was used, the larger amount (corresponding to the second ridge lateral wall surface on the left side in FIG. 2E(t-7) and (t-8)) out of the amounts of side etching generated on both sides of the ridge in the wet etching processes was equal to the thickness of the lateral wall protective layer, the smaller amount (corresponding to the second ridge lateral wall surface on the right side in FIG. 2E(t-7) and (t-8)) out of the same was smaller than the thickness of the lateral wall protective layer and (dimension of third post-dry etching lateral wall surface along direction parallel with substrate surface) 2 (thickness of lateral wall protective layer)−(side etching amount).

Example 3

Now, the present invention will be described more in detail by way of examples for making it still easier to understand the present invention, with reference to FIGS. 2A(a) to (b) used in Embodiment 1 described above and FIGS. 2F(u-1) to (u-2)

and (u-6) to (u-9) subsequent thereto used in Embodiment 2 described above. However, the present invention is not limited to the examples below but can be applied to all ridge stripe semiconductor laser devices.

First, as shown in FIG. 2A(a), an n-type $(Al_{0.7}Ga_{0.3})_{0.5}In_{0.5}P$ cladding layer 103 (with a thickness of 2 μm), a $Ga_{0.5}In_{0.5}P$ active layer 104 (with a thickness of 5 nm), a p-type $(Al_{0.7}Ga_{0.3})_{0.5}In_{0.5}P$ first cladding layer 105 (with a thickness of 0.2 μm), a p-type $Ga_{0.5}In_{0.5}P$ etching stop layer 106 (with a thickness of 10 nm), a p-type $(Al_{0.7}Ga_{0.3})_{0.5}In_{0.5}P$ second cladding layer 108 (with a thickness of 1.2 μm), a p-type $Ga_{0.5}In_{0.5}P$ intermediate layer 109 (with a thickness of 50 nm) and a p-type GaAs contact layer 110 (with a thickness of 0.2 μm) were formed in this order on an n-type GaAs substrate 102 (with a thickness of 450 μm) by MOCVD. Next, an $SiO_2$ film 113 (with a thickness of 0.6 μm) was formed on the p-type GaAs contact layer 110 by an atmospheric pressure CVD.

Incidentally, the n-type GaAs substrate 102 used here was an off-angled substrate whose substrate orientation was tilted by 10° from a (100) plane in a [011] direction.

Next, as shown in FIG. 2A(b), an $SiO_2$ stripe 114 (with a width of 2 μm) was formed by a photolithography technique and a dry etching technique.

Subsequently, as shown in FIG. 2F(u-1), using the $SiO_2$ stripe 114 as a mask, the p-type $(Al_{0.7}Ga_{0.3})_{0.5}In_{0.5}P$ second cladding layer 108, the p-type $Ga_{0.5}In_{0.5}P$ intermediate layer 109 and the p-type GaAs contact layer 110 were dry-etched to a position 200 nm above the p-type $Ga_{0.5}In_{0.5}P$ etching stop layer 106. Here, the dry etching was stopped by time control.

As the dry etching technique, an ICP method was used. Also, as the etching gas, a mixed gas of $SiCl_4$ and Ar was used. As the dry etching condition, the content of $SiCl_4$ in the mixed gas was about 6% by volume, the pressure inside a chamber was about 0.25 Pa, the temperature of a lower electrode was about 150° C., the bias power of the lower electrode was 120 W, and the ICP power was 250 W. As a result, as shown in FIG. 2H, a third post-dry etching lateral wall surface 124 having a curved shape that is convex toward the inside of the ridge was formed between a first ridge lateral wall surface 121 and a post-dry etching bottom surface 122.

Next, as shown in FIG. 2F(u-2), an $SiO_2$ film 129 with a thickness of 300 nm was grown on an entire surface (including ridge lateral surfaces) of an intermediate obtained in FIG. 2F(u-1) by plasma CVD.

Subsequently, as shown in FIG. 2F(u-6), the $SiO_2$ film 129 in the region other than the ridge lateral surfaces was removed by dry etching, thus forming $SiO_2$ lateral wall protective layers 131.

Here, RIE was employed for the dry etching. As the etching gas, a mixed gas of $CF_4$, $CHF_3$ and $O_2$ was used. As the condition for the dry etching, the contents of $CF_4$ and $CHF_3$ in the mixed gas respectively were 5% and 40% by volume, the pressure was 50 Pa, and the temperature of a stage was 150° C.

Thereafter, using a hydrofluoric acid-based chemical solution, a surface treatment of the substrate was carried out for the purpose of removing the residual $SiO_2$ film 129 in the region other than the ridge lateral walls.

Next, as shown in FIG. 2F(u-7), using a mixture chemical solution of tartaric acid, hydrochloric acid and water, the p-type $(Al_{0.7}Ga_{0.3})_{0.5}In_{0.5}P$ second cladding layer 108 was etched until the p-type $Ga_{0.5}In_{0.5}P$ etching stop layer 106 was reached. Here, since the p-type $Ga_{0.5}In_{0.5}P$ etching stop layer 106 was resistant to the hydrochloric acid-based chemical solution, the etching in a direction perpendicular to the substrate surface stops when this layer was exposed. By visual observation of an interference pattern in the etching region, it was determined that the etching in the direction perpendicular to the substrate surface was stopped. The tartaric acid content in the chemical solution was 40% by volume, and the hydrochloric acid content therein was 30% by volume.

Since the $SiO_2$ lateral wall protective layers 131 were highly resistant to the hydrochloric acid-based chemical solution, regions provided with these layers on the ridge lateral wall surfaces were not etched, so that no side etching occurred in top portions of the ridge (first ridge lateral wall surfaces 121).

On the other hand, the regions without the $SiO_2$ lateral wall protective layers 131 on the ridge lateral wall surfaces were etched isotropically. Since the p-type $Ga_{0.5}In_{0.5}P$ etching stop layer 106 was formed, the etching in the direction perpendicular to the substrate surface no longer proceeded once the surface of this etching stop layer 106 was exposed. However, after this was determined by the visual observation of the interference pattern in the etching region as described above, the wet etching was continued for a period equal to that in which, when the p-type $(Al_{0.7}Ga_{0.3})_{0.5}In_{0.5}P$ second cladding layer was a material to be etched, this layer was etched by 100 nm along the direction perpendicular to the substrate surface in order to form a substantially linear inclined surface (a second ridge lateral wall surface 135) in the skirt portion of the ridge (additional etching) (see FIG. 2J). Although the additional etching was continued as described above, the etching did not proceed in the direction perpendicular to the substrate surface because the p-type $Ga_{0.5}In_{0.5}P$ etching stop layer 106 was formed. However, the inclined surface (the second ridge lateral wall surface 135) in the skirt portion of the ridge became linear in most part of the second ridge lateral wall surface 135 in the cross-section perpendicular to the stripe direction of the ridge, thus forming a substantially linear inclined surface. Further, the border between the first ridge lateral wall surface 121 and the second ridge lateral wall surface 135 on one side was a bent portion in which the first ridge lateral wall surface and the second ridge lateral wall surface were connected directly with a certain angle. At the border between these ridge lateral wall surfaces on the other side, a curved third inclined intermediate surface 143 was formed between the first ridge lateral wall surface and the second ridge lateral wall surface.

Subsequently, as shown in FIG. 2F(u-7), the $SiO_2$ lateral wall protective layers 131 alone were removed using a hydrofluoric acid-based chemical solution by time control.

Next, as shown in FIG. 2F(u-8), using the $SiO_2$ stripe 114 as a mask, an n-type $Al_{0.5}In_{0.5}P$ current blocking layer 138 (with a thickness of 0.3 μm) was grown selectively by MOCVD. It should be noted that, before growing the n-type $Al_{0.5}In_{0.5}P$ current blocking layer 138, a surface treatment with a sulfuric acid chemical solution (97% sulfuric acid) was carried out for removing a damaged layer of the ridge lateral walls. At this time, the ridge lateral walls were etched by about 25 nm on one side. Subsequently, using the $SiO_2$ stripe 114 as a mask, an n-type GaAs cap layer 139 (with a thickness of 0.17 μm) was grown selectively by MOCVD.

Subsequently, as shown in FIG. 2F(u-9), after removing the $SiO_2$ stripe 114 with a hydrofluoric acid-based chemical solution, a Ti/Pt/Au p-side electrode 140 (with a thickness of 50/100/50 nm) and an AuGe/Ni/Au n-side electrode 141 (with a thickness of 100/50/400 nm) were formed by vacuum evaporation, thus completing a ridge stripe semiconductor laser wafer.

The resultant ridge-shaped stripe had high perpendicularity and high symmetry, and an angle that the ridge lateral surfaces closer to an upper end of the ridge (the first ridge lateral wall surfaces 121) form with the surface of the n-type GaAs substrate 102 was 87°. On the other hand, angles that the ridge lateral surfaces closer to a lower end of the ridge (the second ridge lateral wall surfaces 135) form with the surface of the n-type GaAs substrate 102 were different on both sides of the ridge because of the use of the n-type GaAs substrate 102 with an off-angle of about 10°, and respectively were 40° (the second ridge lateral wall surface on the left side in FIG. 2F(u-6) and (u-7)) and 62° (the second ridge lateral wall surface on the right side in FIG. 2F(u-6) and (u-7)).

The resultant ridge stripe semiconductor laser wafer had the ridge lateral surfaces having excellent perpendicularity with respect to the substrate surface and the ridge cross-section having excellent right-left symmetry. Also, since the kink level reached 300 mW, which was a maximum measurable value of the measurement instrument that was used, it was confirmed that the kink level exceeded 300 mW at 25° C., showing that a ridge stripe semiconductor laser having an excellent performance was formed in a stable manner.

The case where an SiN dielectric film instead of the n-type $Al_{0.5}In_{0.5}P$ was used as the current blocking layer 138 was carried out similarly. In this case, the conditions were the same except that the n-type GaAs cap layer 139 did not have to be grown. Then, a ridge stripe semiconductor laser having a performance equivalent to that in the case of using the n-type $Al_{0.5}In_{0.5}P$ as the current blocking layer 138 was formed in a stable manner.

Furthermore, in Example 3, the border between the ridge lateral surface formed by the dry etching and the ridge lateral surface formed by the wet etching on one side was a bent portion in which the first ridge lateral wall surface and the second ridge lateral wall surface were connected directly with a certain angle. At the border between these ridge lateral surfaces on the other side, the third inclined intermediate surface was formed between the first ridge lateral wall surface and the second ridge lateral wall surface, with the inclined intermediate surface 143 having an angle of 45°, thus forming a ridge that had a small variation of the refractive index in the skirt portion of the ridge. It should be noted that, in Example 3, the inclined intermediate surface 143 was curved, and the angle of the inclined intermediate surface 143 here was an angle that a tangent line of the inclined intermediate surface 143 at a connection point between the second ridge lateral wall surface 135 and the inclined intermediate surface 143 formed with the surface of the semiconductor substrate. This was because the present example corresponded to the case where the off-angled semiconductor substrate as described in FIG. 2B(l) was used, the larger amount (corresponding to the second ridge lateral wall surface on the left side in FIG. 2F(u-6) and (u-7)) out of the amounts of side etching generated on both sides of the ridge in the wet etching processes was equal to the thickness of the lateral wall protective layer, the smaller amount (corresponding to the second ridge lateral wall surface on the right side in FIG. 2F(u-6) and (u-7)) out of the same was smaller than the thickness of the lateral wall protective layer and (dimension of second post-dry etching lateral wall surface along direction parallel with substrate surface)≧(thickness of lateral wall protective layer)–(side etching amount).

Example 4

Now, the present invention will be described more in detail by way of examples for making it still easier to understand the present invention, with reference to FIGS. 2A(a) to (e) used in Embodiment 1 described above and FIGS. 2K(w-1) to (w-6) and (x) subsequent thereto used in Embodiment 3 described above. However, the present invention is not limited to the examples below but can be applied to all ridge stripe semiconductor laser devices.

First, as shown in FIG. 2A(a), an n-type $(Al_{0.5}Ga_{0.3})_{0.5}In_{0.5}P$ cladding layer 103 (with a thickness of 2 μm), a $Ga_{0.5}In_{0.5}P$ active layer 104 (with a thickness of 5 nm), a p-type $(Al_{0.7}Ga_{0.3})_{0.5}In_{0.5}P$ first cladding layer 105 (with a thickness of 0.2 μm), a p-type $Ga_{0.5}In_{0.5}P$ etching stop layer 106 (with a thickness of 10 nm), a p-type $(Al_{0.7}Ga_{0.3})_{0.5}In_{0.5}P$ second cladding layer 108 (with a thickness of 1.2 μm), a p-type $Ga_{0.5}In_{0.5}P$ intermediate layer 109 (with a thickness of 50 nm) and a p-type GaAs contact layer 110 (with a thickness of 0.2 μm) were formed in this order on an n-type GaAs substrate 102 (with a thickness of 450 μm) by MOCVD. Next, an $SiO_2$ film 113 (with a thickness of 0.6 μm) was formed on the p-type GaAs contact layer 110 by an atmospheric pressure CVD.

Incidentally, the n-type GaAs substrate 102 used here was an off-angled substrate whose substrate orientation was tilted by 10° from a (100) plane in a [011] direction.

Next, as shown in FIG. 2A(b), an $SiO_2$ stripe 114 (with a width of 2 μm) was formed by a photolithography technique and a dry etching technique.

Subsequently, as shown in FIG. 2A(c), using the $SiO_2$ stripe 114 as a mask, the p-type $(Al_{0.7}Ga_{0.3})_{0.5}In_{0.5}P$ second cladding layer 108, the p-type $Ga_{0.5}In_{0.5}P$ intermediate layer 109 and the p-type GaAs contact layer 110 were dry-etched to a position 300 nm above the p-type $Ga_{0.5}In_{0.5}P$ etching stop layer 106. Here, the dry etching was stopped by time control.

As the dry etching technique, an ICP method was used. Also, as the etching gas, a mixed gas of $SiCl_4$ and Ar was used. As the dry etching condition, the content of $SiCl_4$ in the mixed gas was about 11% by volume, the pressure inside a chamber was about 0.7 Pa, the temperature of a lower electrode was about 190° C., the bias power of the lower electrode was 120 W, and the ICP power was 200 W.

Next, as shown in FIG. 2A(d), an $SiO_2$ film 115 with a thickness of 300 nm was grown on an entire surface (including ridge lateral surfaces) of an intermediate obtained in FIG. 2A(c) by plasma CVD.

Subsequently, as shown in FIG. 2A(e), the $SiO_2$ film 115 in the region other than the ridge lateral surfaces was removed by dry etching, thus forming $SiO_2$ lateral wall protective layers 116α and 116β (see FIG. 2K(w-1)).

Here, RIE was employed for the dry etching. As the etching gas, a mixed gas of $CF_4$, $CHF_3$ and $O_2$ was used. As the condition for the dry etching, the contents of $CF_4$ and $CHF_3$ in the mixed gas respectively were 5% and 40% by volume, the pressure was 50 Pa, and the temperature of a stage was 150° C.

Thereafter, using a hydrofluoric acid-based chemical solution, a surface treatment of the substrate was carried out for the purpose of removing the residual $SiO_2$ film 115 in the region other than the ridge lateral walls. At this time, the $SiO_2$ lateral wall protective layers 116α and 116β also were etched by the hydrofluoric acid-based chemical solution, so that they achieved a thickness of 0.12 μm.

Next, as shown in FIG. 2K(w-1), a resist pattern 145 was formed by a photolithography technique.

Subsequently, as shown in FIG. 2K(w-2), the $SiO_2$ lateral wall protective layer 116β was etched using a hydrofluoric acid-based chemical solution so as to form an $SiO_2$ lateral wall protective layer 116γ with a thickness of 0.07 μm, followed by removing the resist pattern 145.

Next, as shown in FIG. 2K(w-3), using a mixture chemical solution of tartaric acid, hydrochloric acid and water, the p-type $(Al_{0.7}Ga_{0.3})_{0.5}In_{0.5}P$ second cladding layer 108 was etched until the p-type $Ga_{0.5}In_{0.5}P$ etching stop layer 106 was reached. Here, since the p-type $Ga_{0.5}In_{0.5}P$ etching stop layer 106 was resistant to the hydrochloric acid-based chemical solution, the etching in a direction perpendicular to the substrate surface stops when this layer was exposed. By visual observation of an interference pattern in the etching region, it was determined that the etching in the direction perpendicular to the substrate surface was stopped. The tartaric acid content in the chemical solution was 40% by volume, and the hydrochloric acid content therein was 30% by volume.

Since the $SiO_2$ lateral wall protective layers 116α and 116γ were highly resistant to the hydrochloric acid-based chemical solution, regions provided with these layers on the ridge lateral wall surfaces were not etched, so that no side etching occurred in top portions of the ridge (first ridge lateral wall surfaces 146).

On the other hand, the regions without the $SiO_2$ lateral wall protective layers 116α and 116γ on the ridge lateral wall surfaces were etched isotropically. Since the p-type $Ga_{0.5}In_{0.5}P$ etching stop layer 106 was formed, the etching in the direction perpendicular to the substrate surface no longer proceeded once the surface of this etching stop layer 106 was exposed. However, after this was determined by the visual observation of the interference pattern in the etching region as described above, the wet etching was continued for a period equal to that in which, when the p-type $(Al_{0.7}Ga_{0.3})_{0.5}In_{0.5}P$ second cladding layer was a material to be etched, this layer was etched by 200 nm along the direction perpendicular to the substrate surface in order to form a substantially linear inclined surface (a second ridge lateral wall surface 147) in the skirt portion of the ridge (additional etching). Although the additional etching was continued as described above, the etching did not proceed in the direction perpendicular to the substrate surface because the p-type $Ga_{0.5}In_{0.5}P$ etching stop layer 106 was formed. However, the inclined surface (the second ridge lateral wall surface 147) in the skirt portion of the ridge became linear in the most upper part of the second ridge lateral wall surface 147 in the cross-section perpendicular to the stripe direction of the ridge, thus forming a substantially linear inclined surface.

Subsequently, as shown in FIG. 2K(w-4), the $SiO_2$ lateral wall protective layers 116α and 116γ alone were removed using a hydrofluoric acid-based chemical solution by time control.

Next, as shown in FIG. 2K(w-5), using the $SiO_2$ stripe 114 as a mask, an n-type $Al_{0.5}In_{0.5}P$ current blocking layer 148 (with a thickness of 0.3 μm) was grown selectively by MOCVD. It should be noted that, before growing the n-type $Al_{0.5}In_{0.5}P$ current blocking layer 148, a surface treatment with a sulfuric acid chemical solution was carried out for removing a damaged layer of the ridge lateral walls. At this time, the ridge lateral walls were etched by about 25 nm on one side. Subsequently, using the $SiO_2$ stripe 114 as a mask, an n-type GaAs cap layer 149 (with a thickness of 0.17 μm) was grown selectively by MOCVD.

Subsequently, as shown in FIG. 2K(w-6), after removing the $SiO_2$ stripe 114 with a hydrofluoric acid-based chemical solution, a Ti/Pt/Au p-side electrode 150 (with a thickness of 50/100/50 nm) and an AuGe/Ni/Au n-side electrode 151 (with a thickness of 100/50/400 nm) were formed by vacuum evaporation, thus completing a ridge stripe semiconductor laser wafer.

The resultant ridge-shaped stripe had high perpendicularity and high symmetry, and an angle that the ridge lateral surfaces closer to an upper end of the ridge (the first ridge lateral wall surfaces 146) form with the surface of the n-type GaAs substrate 102 was 90°. On the other hand, angles that the ridge lateral surfaces closer to a lower end of the ridge (the second ridge lateral wall surfaces 147) form with the surface of the n-type GaAs substrate 102 were different on both sides of the ridge because of the use of the n-type GaAs substrate 102 with an off-angle of about 10°, and respectively were 40° and 62°.

Moreover, in the ridge top portion formed in the present example, the p-type $Ga_{0.5}In_{0.5}P$ intermediate layer 109 and the p-type GaAs contact layer 110 did not protrude to form eaves-like overhangs. Thus, at the time of growing the n-type $Al_{0.5}In_{0.5}P$ current blocking layer 148, cavities were not formed.

The resultant ridge stripe semiconductor laser wafer had the ridge lateral surfaces having excellent perpendicularity with respect to the substrate surface and the ridge cross-section having excellent right-left symmetry. Also, since the kink level reached 300 mW, which was a maximum measurable value of the measurement instrument that was used, it was confirmed that the kink level exceeded 300 mW at 25° C., showing that a ridge stripe semiconductor laser having an excellent performance was formed in a stable manner.

The case where an SiN dielectric film instead of the n-type $Al_{0.5}In_{0.5}P$ was used as the current blocking layer 148 was carried out similarly. In this case, the conditions were the same except that the n-type GaAs cap layer 149 did not have to be grown. Then, a ridge stripe semiconductor laser having a performance equivalent to that in the case of using the n-type $Al_{0.5}In_{0.5}P$ as the current blocking layer 148 was formed in a stable manner.

Furthermore, in Example 4, the thicknesses of the lateral wall protective layers 116α and 116γ were adjusted so that (thickness of lateral wall protective layer)=(side etching amount) on both sides of the ridge. Thus, the border between the ridge lateral surface formed by the dry etching and the ridge lateral surface formed by the wet etching was a bent portion in which the first ridge lateral wall surface and the second ridge lateral wall surface were connected directly with a certain angle. This was because the present example corresponded to the case where, when the off-angled semiconductor substrate as described above was used, the side etching amounts on both sides of the ridge in the wet etching processes respectively were equal to the thicknesses of the lateral wall protective layers.

INDUSTRIAL APPLICABILITY

As described above, according to the present invention, improved element characteristics such as a uniform horizontal radiation angle of a laser beam, an improved differential quantum efficiency and an improved kink level can be achieved in a ridge stripe semiconductor laser device. Further, a ridge-shaped stripe can be formed with excellent uniformity on a wafer surface and between wafers, thus allowing a yield improvement. Therefore, the present invention can be utilized effectively in ridge stripe semiconductor laser devices. These semiconductor laser devices are applicable to rewritable optical disks and the like.

The invention claimed is:

1. A ridge stripe semiconductor laser device, comprising a first conductivity type cladding layer, an active layer, a second conductivity type first cladding layer, an etching stop layer, a second conductivity type second cladding layer formed as a stripe-shaped ridge, and a current blocking layer formed in a region except for at least a part on the ridge these layers being disposed on a compound semiconductor substrate, wherein an orientation of a surface of the semiconductor substrate on which these layers are disposed is tilted by a predetermined angle from a (100) plane, wherein in a cross-section perpendicular to a stripe direction of the ridge, each of both lateral surfaces of the ridge comprises a first surface that is substantially perpendicular to a surface of the semiconductor substrate and extends downward from an upper end of the ridge, and a second surface that is formed of a substantially linear skirt portion inclined surface that is inclined obliquely downward to an outside of the ridge in a skirt portion of the ridge, the first surface and the second surface are connected via a third intermediate surface, the third intermediate surface is on each of both lateral surfaces of the ridge, (b1) a substantially linear step surface that protrudes toward the outside of the ridge, is substantially parallel with the surface of the semiconductor substrate and has a length not greater than 0.2 μm in the cross-section, or (b2) an inclined intermediate surface that protrudes obliquely downward to the outside of the ridge, has a linear shape or a curved shape that is convex toward an inside of the ridge, and has a length not greater than 0.2 μm along the direction parallel with the substrate surface in the cross-section, and a (111) plane of a semiconductor constituting the second cladding layer is exposed in the second surface, and wherein the (111) plane is exposed in at least 50% of an area of the second surface.

2. The ridge stripe semiconductor laser device according to claim 1, wherein in the cross-section perpendicular to the stripe direction of the ridge, an angle that the first surface forms with the surface of the semiconductor substrate is 85° to 95°.

3. The ridge stripe semiconductor laser device according to claim 1, wherein the length of the substantially linear step surface that serves as the third intermediate surface and is substantially parallel with the surface of the semiconductor substrate is not greater than a thickness of the current blocking layer in the lateral surfaces of the ridge.

4. The ridge stripe semiconductor laser device according to claim 1, wherein the (100) plane is tilted in a direction.

5. The ridge stripe semiconductor laser device according to claim 1, wherein an angle that the second surface forms with the surface of the semiconductor substrate differs between the ridge lateral walls on both sides, the angle is 40° to 50° on one side and is 60° to 70° on the other side.

* * * * *